United States Patent
Perssson et al.

(12) United States Patent
Persson et al.

(10) Patent No.: US 7,330,073 B2
(45) Date of Patent: Feb. 12, 2008

(54) ARBITRARY WAVEFORM PREDISTORTION TABLE GENERATION

(75) Inventors: Jonas Persson, Lund (SE); Per-Olof Brandt, Lomma (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 238 days.

(21) Appl. No.: 11/168,404

(22) Filed: Jun. 29, 2005

(65) Prior Publication Data
US 2006/0071711 A1    Apr. 6, 2006

Related U.S. Application Data

(60) Provisional application No. 60/616,493, filed on Oct. 6, 2004.

(51) Int. Cl.
*H03F 1/26* (2006.01)
(52) U.S. Cl. ..................... 330/149; 375/297
(58) Field of Classification Search ............... 330/149; 375/297; 455/114.3
See application file for complete search history.

(56) References Cited

U.S. PATENT DOCUMENTS

| | | | |
|---|---|---|---|
| 5,903,611 A | 5/1999 | Schnabl et al. | |
| 5,929,703 A | 7/1999 | Schier et al. | |
| 6,072,364 A | 6/2000 | Jeckeln et al. | |
| 6,304,140 B1 | 10/2001 | Thron et al. | |
| 6,642,786 B1 | 11/2003 | Jin et al. | |
| 6,801,086 B1 | 10/2004 | Chandrasekaran | |
| 7,068,984 B2 * | 6/2006 | Mathe et al. | 455/126 |
| 7,129,778 B2 * | 10/2006 | Robinson | 330/151 |
| 2003/0058959 A1 | 3/2003 | Rafie et al. | |
| 2003/0184374 A1 | 10/2003 | Huang et al. | |
| 2003/0215026 A1 | 11/2003 | Hietala | |
| 2004/0142667 A1 | 7/2004 | Lochhead et al. | |
| 2004/0151257 A1 | 8/2004 | Staszewski et al. | |

FOREIGN PATENT DOCUMENTS

| | | |
|---|---|---|
| EP | 1 011 192 A2 | 6/2000 |
| EP | 1 158 662 A | 11/2001 |

(Continued)

OTHER PUBLICATIONS

PCT International Search Report, dated Dec. 1, 2005, in connection with International Application No. PCT/EP2005/010374.

(Continued)

*Primary Examiner*—Henry Choe
(74) *Attorney, Agent, or Firm*—Potomac Patent Group PLLC

(57) ABSTRACT

Predistortion that will compensate for distortion introduced by a power amplifier circuit is determined by applying a time-varying reference signal to the power amplifier circuit, wherein at each moment the time-varying reference signal has a reference amplitude and a reference phase. A corresponding output signal supplied by the power amplifier circuit is measured, wherein at each moment the output signal has a measured amplitude and a measured phase. Amplitude predistortion is determined by comparing the reference amplitude with the measured amplitude, and phase predistortion is determined by comparing the reference phase with the measured phase. A relationship between the phase predistortion and the reference amplitude is determined such that, for any value of the reference amplitude, a corresponding value of the phase predistortion is identified.

31 Claims, 16 Drawing Sheets

FOREIGN PATENT DOCUMENTS

| | | |
|---|---|---|
| EP | 1 455 444 A | 9/2004 |
| GB | 2 388 983 A | 11/2003 |
| WO | WO 03/043183 A1 | 5/2003 |

OTHER PUBLICATIONS

PCT Written Opinion, dated Dec. 1, 2005, in connection with International Application No. PCT/EP2005/010374.

Naskas, Nikos et al., "A Convergence-Free Predistortion Technique for Adaptive Linearisation of RF Power Amplifiers," Analog Integrated Circuits and Signal Processing, 41, 109-118, 2004, Kluwer Academic Publishers, The Netherlands.

PCT International Preliminary Report on Patentability, dated Sep. 12, 2006, in connection with International Application No. PCT/EP2005/010374.

* cited by examiner

ARBITRARY WAVEFORM PREDISTORTION TABLE GENERATION

CROSS REFERENCE TO RELATED APPLICATIONS

This application claims the benefit of U.S. Provisional Application No. 60/616,493, filed Oct. 6, 2004, which is hereby incorporated herein by reference in its entirety.

BACKGROUND

The present invention relates to power amplifiers, such as the type used in wireless communications, and more particularly relates to determining and implementing a predistorting adjustment of a signal prior to amplification by a power amplifier for the purpose of compensating for distortion introduced by the power amplifier.

Power amplifiers are widely used in telecommunications. For example, in wireless communication applications, power amplifiers are found in the last stage of transmitter circuits, where they are used to boost the power of a supplied signal to an acceptable level for transmission from an antenna. In addition, power amplifiers are often provided with an amplitude modulation (AM) function, which enables them to operate in accordance with non-constant envelope modulation schemes, such as those used in EDGE (Enhanced Data rates for GSM Evolution), Code Division Multiple Access (CDMA), Wideband CDMA (WCDMA), and the like. Even when constant amplitude modulation schemes are being used, the AM functionality of a power amplifier may be applied for power control when the transmission is performed in time slots, such as occurs in time division multiple access (TDMA) systems, of which the Global System for Mobile communications (GSM) and EDGE are but two such examples.

One problem with using commercially available power amplifiers in applications such mobile communications is that they typically exhibit distortion. For example, consider a reference input (called AMref) that is an intermediate frequency (IF) signal representing the envelope (AM) of a radio frequency (RF) signal to be modulated in any of a number of modulation schemes. Ideally, supplying AM ref to the AM input of a power amplifier will produce an RF AM signal at the output of the power amplifier without distortion. In practice, however, there is distortion generated in the power amplifier: AMref to Phase Modulation distortion (PMdist) and AMref to AM. These types of distortion can be abbreviated as AM/PM and AM/AM, respectively.

In communications applications where information is encoded in the phase and/or amplitude of the signal, the added distortion can cause serious errors to occur when the receiver attempts to extract the intended information. To avoid this undesirable result, it is possible to adjust the signal prior to its amplification in a way that will cancel out the distortion known to be added by the power amplifier. This is called "predistorting" the signal, and the amount of amplitude and phase adjustment that needs to be applied for this purpose is called "predistortion."

It is possible to build a power amplifier having built-in predistortion, but since standard "off the shelf" components from different power amplifier vendors don't have this feature, the distortion usually has to be accounted/compensated for in other parts of the communication equipment.

It is possible to introduce predistortion in different ways to compensate for the distortion in the power amplifiers. An important aspect in this regard is that different samples of the same nominal power amplifier component will exhibit different AM/PM and AM/AM characteristics. Furthermore, the power amplifier-modulator will have varying AM/PM and AM/AM distortion over wide frequency bands. This means that different predistortion compensation is required for different power amplifiers and frequencies.

During manufacturing/production of a communications device, such as a mobile station (MS), different kinds of calibrations are made. It is desirable to have a calibration method for finding the power amplifier distortion and for applying the compensation (predistortion) needed. One way of finding the best predistortion values is to optimize the values by comparing a measured spectrum performance to an ideal spectrum performance. This type of analysis can be very time consuming though and a fast and accurate solution would be much more desirable. The problem is made even more difficult by the fact that the measurement data is also expected to be noisy, which slows the measurement process even further.

Most conventional predistortion algorithms are based on measurements of different figures of quality, such as Error Vector Modulation (EVM) and/or "spectrum due to modulation." Consequently, an iterative process is then required for finding a predistortion that gives sufficiently good results. However, having to perform so many different types of measurements and then performing the necessary iterations for arriving at the acceptable results is very time consuming.

It is therefore desirable to have a calibration system for use in production of communication equipment that helps to 1) get excellent/robust performance of the communication equipment and 2) save time and money.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods, apparatuses, and programmable instructions stored on machine readable storage media that determine predistortion that will compensate for distortion introduced by a power amplifier circuit. Determining the predistortion comprises applying a time-varying reference signal to the power amplifier circuit, wherein at each moment the time-varying reference signal has a reference amplitude and a reference phase. A corresponding output signal supplied by the power amplifier circuit is measured, wherein at each moment the output signal has a measured amplitude and a measured phase. Amplitude predistortion is determined by comparing the reference amplitude with the measured amplitude. Phase predistortion is determined by comparing the reference phase with the measured phase. A relationship between the phase predistortion and the reference amplitude is determined such that, for any value of the reference amplitude, a corresponding value of the phase predistortion is identified.

The reference signal can take on any form, such as one wherein the reference amplitude is a ramp waveform, and the reference phase is a constant; one wherein the reference amplitude is a triangle waveform, and the reference phase is a constant; and one wherein the reference signal has both varying amplitude and varying phase.

In another aspect, the amplitude predistortion is associated with a range of measured amplitude values and determining predistortion further comprises extracting representative points from the amplitude predistortion by performing dividing the range of measured amplitude values into a number of intervals; and for each of the intervals, determining an average amplitude predistortion value and using the average amplitude predistortion value as the amplitude predistortion value associated with a measured amplitude value at the center of the interval.

Such embodiments may further comprise interpolating between two average amplitude predistortion values respectively associated with adjacent first and second intervals to determine an amplitude predistortion value associated with a reference amplitude value that is in-between the centers of the first and second intervals.

In still another aspect, the phase predistortion is associated with a range of reference amplitude values; and determining predistortion further comprises extracting representative points from the phase predistortion by performing dividing the range of reference amplitude values into a number of intervals; and for each of the intervals, determining an average phase predistortion value and using the average phase predistortion value as the phase predistortion value associated with a reference amplitude value at the center of the interval.

Such embodiments may further comprise interpolating between two average phase predistortion values respectively associated with adjacent first and second intervals to determine a phase predistortion value associated with a reference amplitude value that is in-between the centers of the first and second intervals.

In yet another aspect, prior to comparing the reference amplitude with the measured amplitude, one or more dips in the reference amplitude are identified, and one or more dips in the measured amplitude are identified. The reference amplitude and the measured amplitude are aligned with respect to time by shifting the reference amplitude and the measured amplitude relative to one another by an amount that best aligns the dips of the reference amplitude with corresponding dips of the measured amplitude.

In still another aspect, prior to comparing the reference phase with the measured phase, one or more dips in the reference phase are identified, and one or more dips in the measured phase are identified. The reference phase and the measured phase are then aligned with respect to time by shifting the reference phase and the measured phase relative to one another by an amount that best aligns the dips of the reference phase with corresponding dips of the measured phase.

In alternative embodiments, prior to comparing the reference amplitude with the measured amplitude, the reference amplitude and the measured amplitude are aligned with respect to time by an amount that minimizes a spread between a plurality of amplitude predistortion values associated with any one amplitude reference value.

In some embodiments, the spread is determined by determining the difference between a minimum one of the amplitude predistortion values associated with the amplitude reference value and a maximum one of the amplitude predistortion values associated with the amplitude reference value.

Alternatively, determining the spread involves determining a set of highest valued ones of the amplitude predistortion values associated with the amplitude reference value; determining a set of lowest valued ones of the amplitude predistortion values associated with the amplitude reference value; determining a noise reduced maximum value of the amplitude predistortion values by averaging the set of highest valued ones of the amplitude predistortion values associated with the amplitude reference value; determining a noise reduced minimum value of the amplitude predistortion values by averaging the set of lowest valued ones of the amplitude predistortion values associated with the amplitude reference value; and determining the spread by determining the difference between the noise reduced minimum value of the amplitude predistortion values and the noise reduced maximum value of the amplitude predistortion values.

In yet another aspect, prior to comparing the reference phase with the measured phase, the reference phase and the measured phase are aligned with respect to time by an amount that minimizes a spread between a plurality of phase predistortion values associated with any one amplitude reference value. Again, this may be performed in any of a number of ways. For example, the spread may be determined by determining the difference between a minimum one of the phase predistortion values associated with the amplitude reference value and a maximum one of the phase predistortion values associated with the amplitude reference value. Alternatively, a set of highest valued ones of the phase predistortion values associated with the amplitude reference value are determined; and a set of lowest valued ones of the phase predistortion values associated with the amplitude reference value are determined. A noise reduced maximum value of the phase predistortion values is determined by averaging the set of highest valued ones of the phase predistortion values associated with the amplitude reference value, and a noise reduced minimum value of the phase predistortion values is determined by averaging the set of lowest valued ones of the phase predistortion values associated with the amplitude reference value. Determining the spread is then accomplished by determining the difference between the noise reduced minimum value of the phase predistortion values and the noise reduced maximum value of the phase predistortion values.

BRIEF DESCRIPTION OF THE DRAWINGS

The objects and advantages of the invention will be understood by reading the following detailed description in conjunction with the drawings in which.

DETAILED DESCRIPTION

Figure 1:
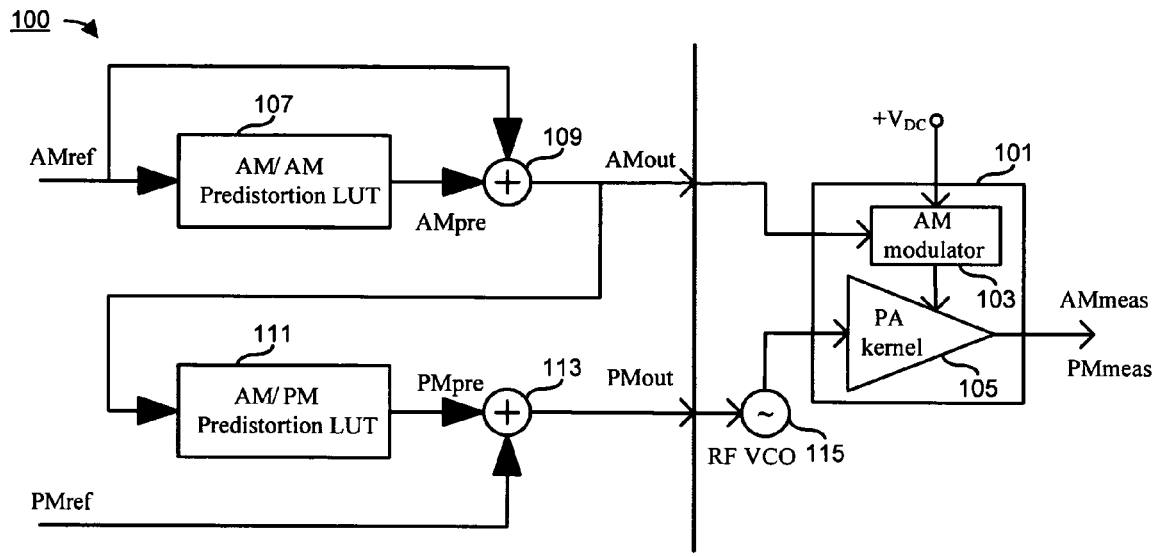
FIG. 1 is a block diagram of a LUT-based approach for generating and applying predistortion to a polar power amplifier.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

The various exemplary embodiments described herein address a number of problems relating to predistortion associated with power amplifiers, while avoiding the need for an iterative measurement/analysis process during manufacturing. An aspect of these embodiments associated with this improvement is the focus on the reasons for the system performance degradation (i.e. AM/AM and AM/PM), instead of the actual system performance itself.

Various embodiments described below are "optimal" in some sense because they aim to reduce the AM/AM- and AM/PM-distortion. Moreover, these embodiments operate quickly because they do not rely on iterative measurement/analysis techniques. In other aspects, "extracting" techniques are disclosed that make the predistortion implementation feasible even for noisy and/or modulated measurement results. These and other aspects of the invention will now be described in greater detail.

There are different ways in which predistortion can be applied, depending upon on the baseband architecture and the type of transmitter (or transceiver) solution the radio consists of. To illustrate various aspects of the invention, the examples disclosed here use Look Up Tables (LUTs) to generate and apply the predistortion. The invention is not limited to such embodiments, however. Moreover, the discussions and examples in this document focus on a situation where the transmitter is of a polar modulation type. FIG. 1 is a block diagram of a LUT-based arrangement 100 for generating and applying predistortion to a signal to be amplified by a polar power amplifier.

Reference AM and PM input signals are referred to herein as AMref and PMref respectively, and are generated by a wave form generator (WFG) (not shown). The AMref signal is supplied to an AM path of the arrangement 100. Similarly, the PMref signal is supplied to a PM path of the arrangement 100. The AM path generates an amplitude predistortion signal AMpre, which is supplied to an envelope control input of a polar power amplifier 101. The PM path generates a phase predistortion signal PMpre, which will vary the phase of an RF signal supplied to an RF input of the power amplifier 101. The power amplifier 101 includes an AM modulator 103 that uses the AMout signal to control the amplitude of the output signal generated by the power amplifier 101. The power amplifier 101 also includes a "kernel" portion 105, which is responsible for amplifying the power of a supplied RF input signal.

The AM path includes an AM/AM predistortion LUT 107, which receives the AMref signal, and generates therefrom a predistortion signal AMpre, which is supplied at its output. Combining circuitry 109 combines the AM predistortion signal, AMpre, with the original AM reference signal, AMref, such that the output signal, AMout, supplied at the output of the combining circuitry 109 (and which represents the output from the AM path) is the sum of the AMref signal and the AMpre signal according to:

$$AMout = AMref + AMpre(AMref), \quad (1)$$

where the notation AMpre(AMref) indicates the AMpre value as a function of the AMref signal.

AMout is the predistorted AM signal that serves as input signal to the envelope control input of the polar amplifier 101.

The AMout signal is also supplied to an AM/PM predistortion LUT 111, which generates therefrom a PM predistortion signal, PMpre, which is supplied at its output. Combining circuitry 113 combines the PM predistortion signal, PMpre, with the original PM reference signal, PMref, such that the output signal, PMout, supplied at the output of the combining circuitry 113 (and which represents the output from the PM path) is the sum of the PMref signal and the PMpre signal according to:

$$PMout = PMref + PMpre(AMout) \quad (2)$$

PMout is the predistorted phase information that is delivered to the RF input of the power amplifier 101 via the RF transmitter's phase modulator 115. It will be noted that the PMpre signal is dependant on the AMout signal, which dependency is indicated by the notation PMpre(AMout).

The discussion will now take a closer look at techniques for determining the contents of the two lookup tables 107, 111 that generate the signals AMpre and PMpre respectively. Two different embodiments will be described: one which is herein called "the Triangle Wave Method" and another, which is herein called "the Modulation Method".

Figure 2:
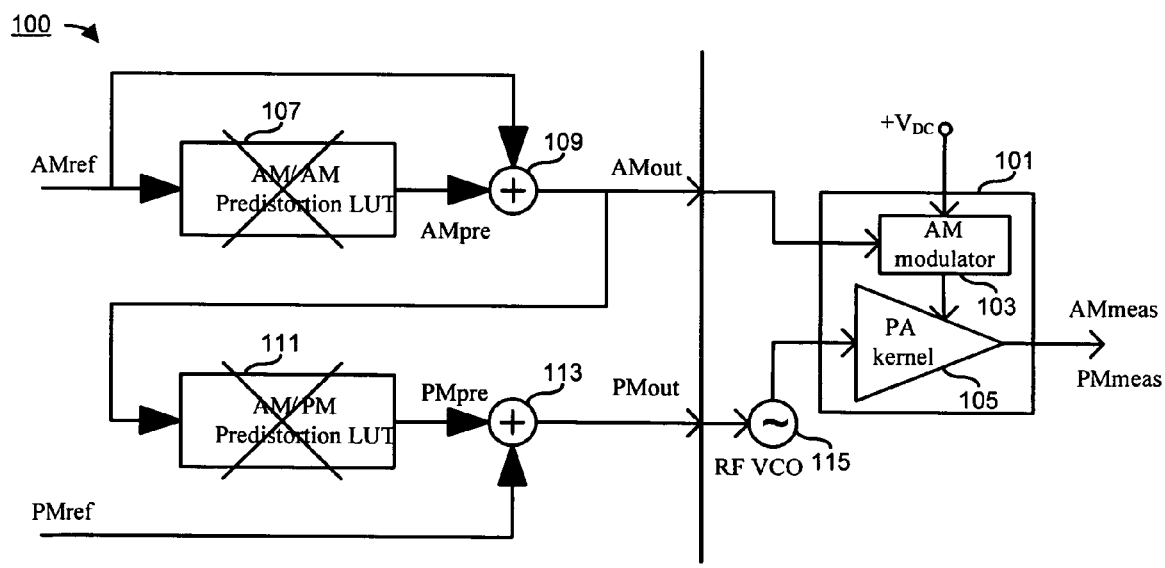
FIG. 2 shows how the arrangement of FIG. 1 is configured so as to enable the power amplifier distortion to be characterized.

FIG. 2 shows how the arrangement of FIG. 1 is configured so as to enable the power amplifier distortion to be characterized. Essentially, the AM/AM predistortion LUT 107 and the AM/PM predistortion LUT 111 are both disabled. Consequently, AMout=AMref and PMout=PMref.

Looking first at embodiments employing the Triangle Wave Method, as the name implies a triangle wave, or linear ramp is used as the reference signal, AMref, for the amplitude modulation. The phase reference signal, PMref, is set to be constant.

Considering FIG. 1 again, the AM path can be described as $$AMmeas = AMout + H_{AMAM\{AMout\}}, \quad (3)$$

where $H_{AMAM}$ is the function causing the AM/AM distortion in the power amplifier 101. To factor in the effect of the predistortion, we evaluate equation (3) using equation (1), which gives $$AMmeas = AMref + AMpre + H_{AMAM\{AMout\}} \quad (4)$$

It's clear from equation (4) that choosing $$AMpre = -H_{AMAM\{AMout\}} \quad (5)$$

will result in AMmeas=AMref in the circuit of FIG. 1, thereby serving to compensate for the AM distortion introduced by the power amplifier 101.

Figure 3:
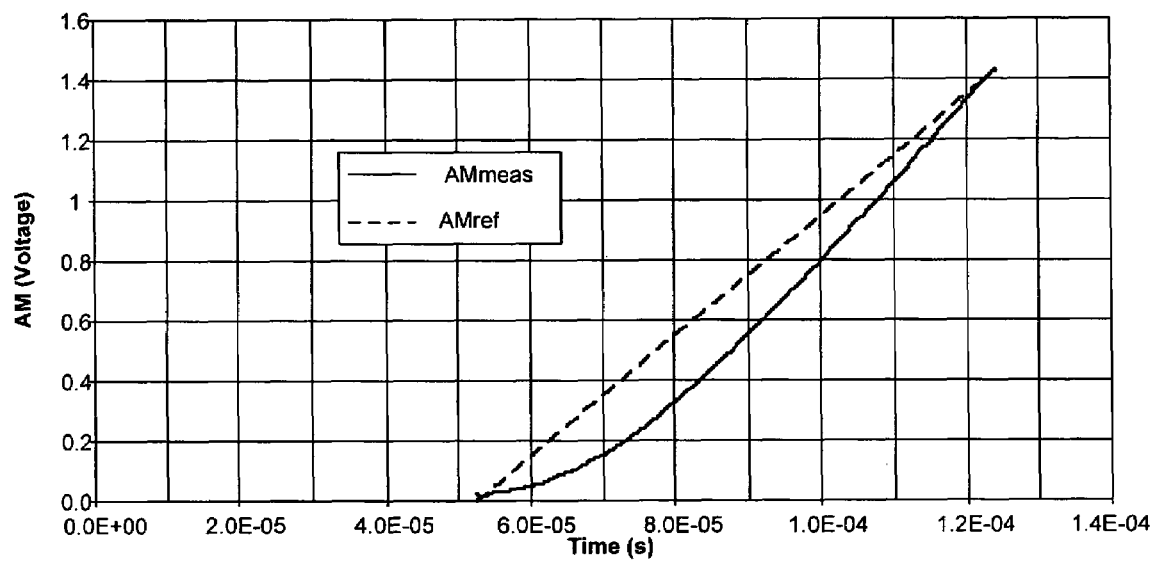
FIG. 3 is a graph depicting, for a typical power amplifier module, a comparison between an applied triangle or ramp waveform used as an AM reference signal and the measured AM output, after having aligned the two signals in time.

To find what AM predistortion to use, we compare AMmeas (i.e., the RF envelope measured at the output of the power amplifier module), with AMref (i.e., the AM reference signal). The result for a typical power amplifier, after having aligned the two signals in time, can look as shown in the graph of FIG. 3.

Figure 4:
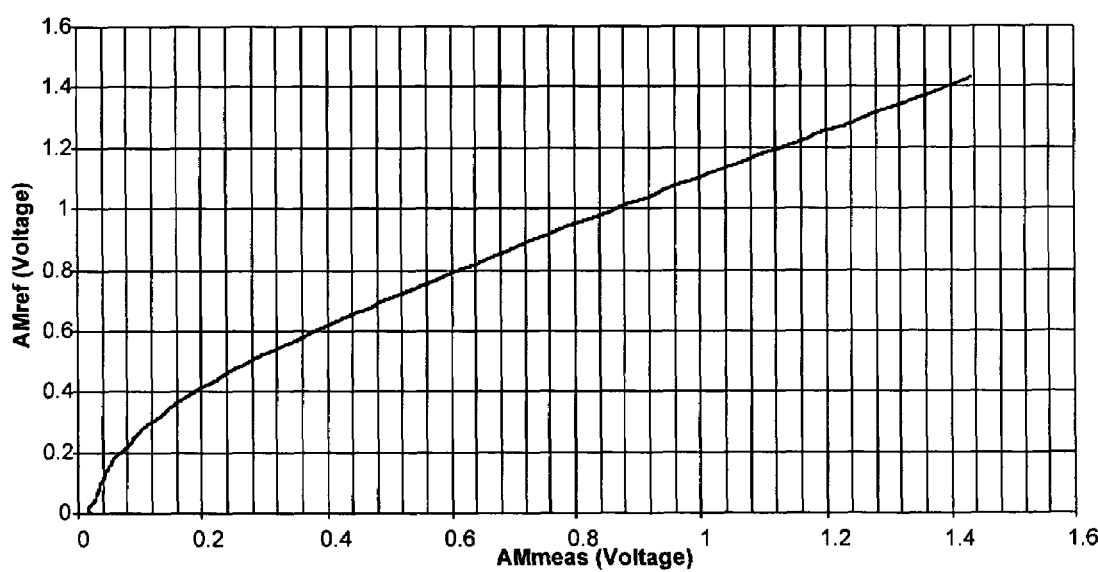
FIG. 4 is a graph of the information depicted in FIG. 3, but rearranged so that AMref is found on the vertical (i.e., y) axis and AMmeas on the horizontal (i.e., x) axis.

These curves show the relationship between AMmeas and AMref. It is desired to know what AMref to use in order to obtain a certain AMmeas, so it is helpful to rearrange the information as shown in the graph of FIG. 4, where AMref is found on the vertical (i.e., y) axis and AMmeas on the horizontal (i.e., x) axis.

The amplitude predistortion can now be calculated. Using equations (3) and (5), and remembering that AMout=AMref during the predistortion characterization phase, we obtain $$AMpre = AMref - AMmeas \quad (6)$$

Figure 5:
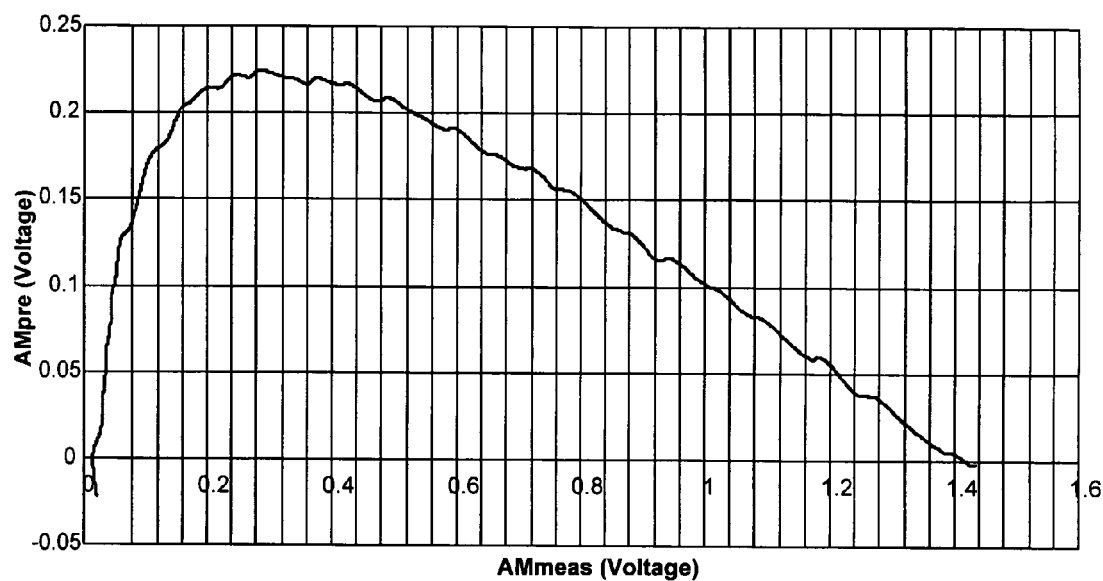
FIG. 5 is a graph depicting the AM predistortion (i.e., the relationship between AMpre and AMmeas) for the power amplifier used in these examples.

FIG. 5 is a graph depicting the AM predistortion (i.e., the relationship between AMpre and AMmeas) for the power amplifier used in these examples.

A second part of the predistortion characterization technique determines the PM predistortion to be used in the AM/PM predistortion LUT 111. As mentioned before, the Triangle Wave Method uses a triangle wave, or a linear ramp, as a reference signal for the amplitude modulation. The phase reference signal is however set to be constant.

Referring to FIG. 1, the input-output relation for the PM path can be expressed as $$PMmeas = PMout + H_{AMPM\{AMout\}} \quad (7)$$

where $H_{AMPM}$ is the function causing the AM/PM distortion. Evaluating equation (7) using equation (2) gives $$PMmeas = PMref + PMpre + H_{AMPM\{AMout\}} \quad (8)$$

from which it's clear that choosing $$PMpre = -H_{AMPM\{AMout\}} \quad (9)$$

will result in PMmeas=PMref, thereby serving the desired purpose of compensating for the phase distortion.

Figure 6:
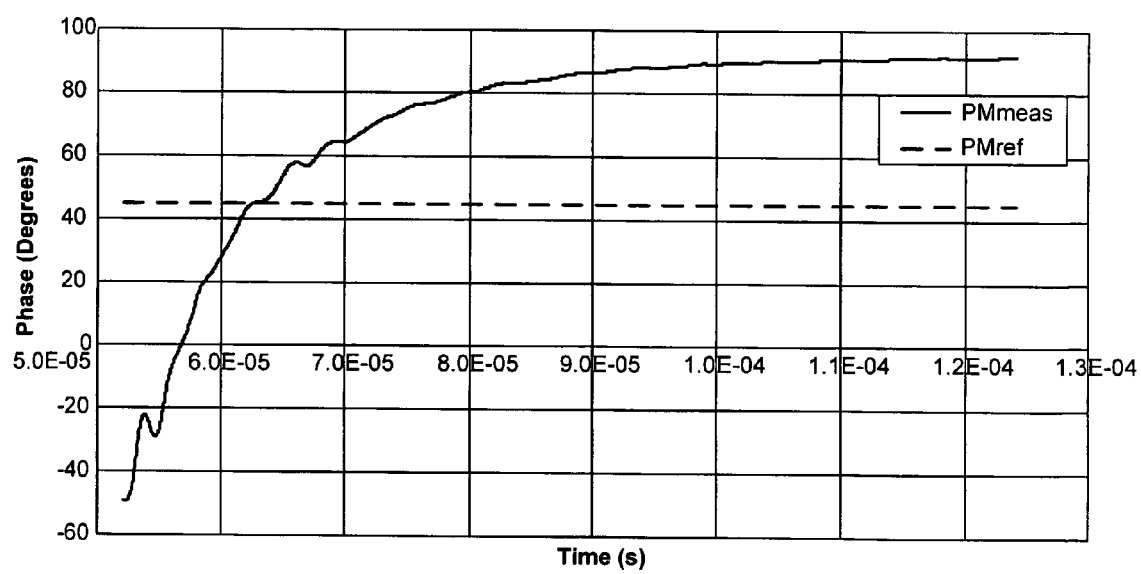
FIG. 6 is a graph depicting, for a typical power amplifier module, a comparison between an applied constant phase reference signal and the measured phase of an RF signal at the output of the power amplifier module.

To find what PM predistortion to use, the signal PMmeas (i.e., the phase of the RF signal measured at the output of the PA module) is compared to the PMref signal (i.e., the phase reference signal). For a typical power amplifier, the result can look as shown in the graph of FIG. 6.

The phase predistortion can now be calculated. Using equations (7) and (9) and remembering that PMout=PMref during characterization, we obtain $$PMpre = PMref - PMmeas \quad (10)$$

Figure 7:
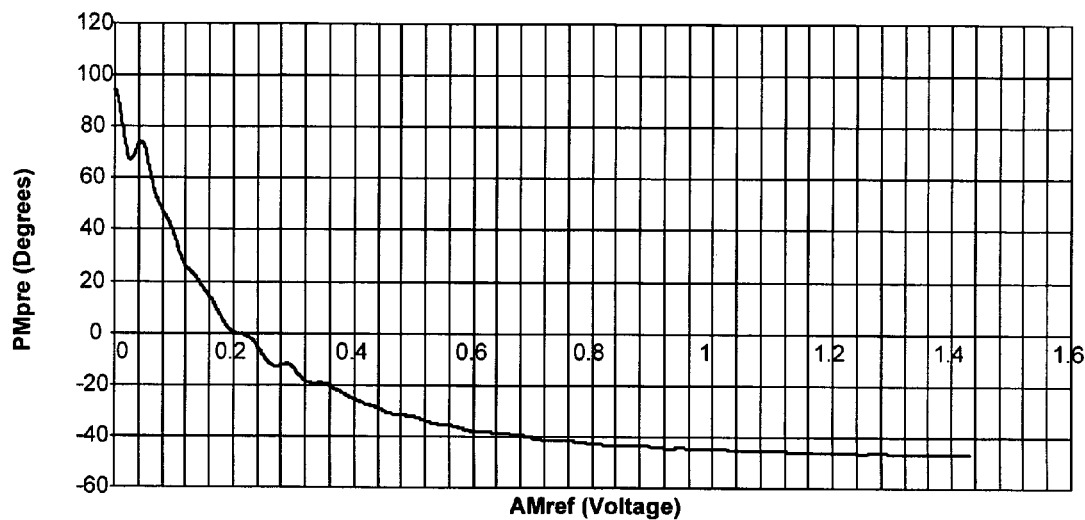
FIG. 7 is a graph showing the PM predistortion, that is, the relationship between the signal PMpre and the signal AMref, for an exemplary power amplifier.

FIG. 7 is a graph showing the PM predistortion, that is, the relationship between the signal PMpre and the signal AMref, for the power amplifier used in this example.

Figure 8:
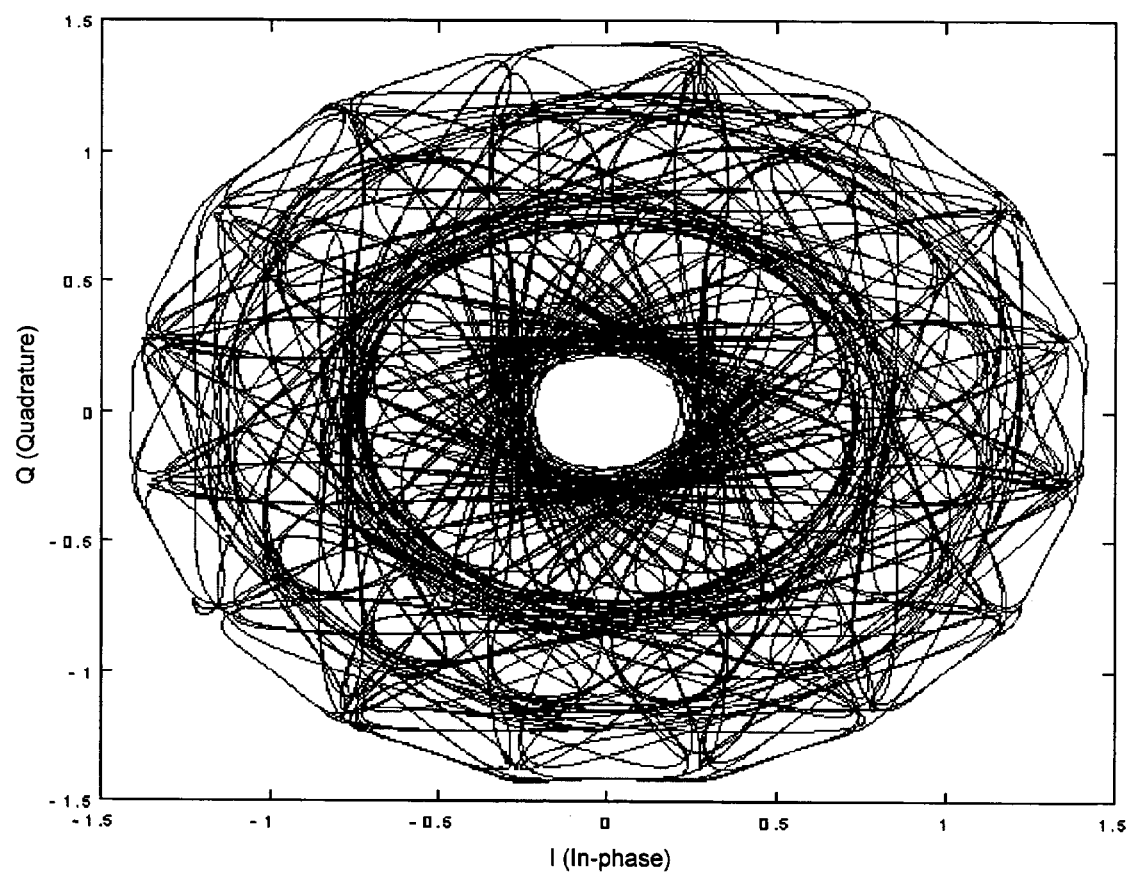
FIG. 8 is an I/Q diagram of a typical EDGE-modulated signal.

The description will now focus on an alternative embodiment for determining suitable AM/AM and AM/PM predistortion, one that is herein called "the Modulation Method." As the name implies, a modulated (e.g., EDGE) signal is used as the reference signal in this case instead of the triangular wave. An EDGE signal uses 3π/8-8PSK modulation. This means that some part of the information lies in the amplitude (envelope) of the transmitted signal and some part lies in the phase of the transmitted signal. In other words, this is a combination of AM and PM. FIG. 8 is a diagram of a typical EDGE signal. It will be observed that constellation points are defined at various amplitudes and phases on the In-phase/Quadrature phase (I/Q) plane.

Figure 9:
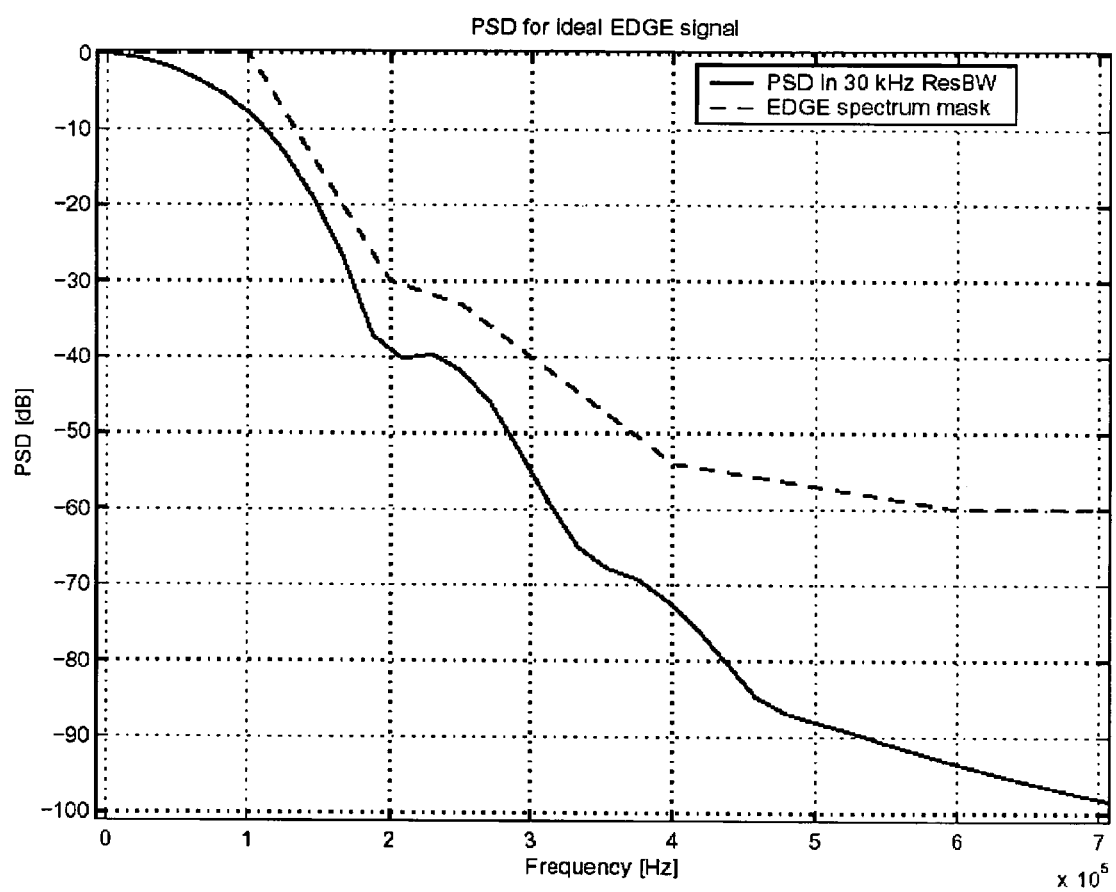
FIG. 9 is a graph showing the spectrum characteristics of an EDGE-modulated signal.

FIG. 9 shows the power spectrum characteristics of an EDGE-modulated signal. The vertical axis shows the Power Spectral Density (PSD), expressed in dB; and the horizontal axis is the distance in frequency from the carrier, expressed in Hz. The dashed curve shows the requirements on "spectrum due to modulation".

Accordingly, when an EDGE-modulated signal is applied as the reference signal in the configuration depicted in FIG. 2, two signals are presented at the input: one with the EDGE amplitude part, and one with the EDGE phase information part. The measurement data from which the predistortion tables are derived/generated, look rather different compared to that in the "triangle wave" case but—from an automation point of view—there is no difference between the "Triangle Method" and the "Modulation Method". Moreover, the algorithm used during generation of LUT entries can also be the same, which will be seen in the discussion that follows.

The predistortion results obtained by means of any of the above-described techniques can be used in different ways:
1. As a look-up table, with enough points for adequate quantization distortion.
2. With fewer points and interpolation.
3. As a table from which a polynomial is generated.

The discussion will now focus on aspects relating to item number 2).

It is desired to have the power amplifier characterization process be both fast and accurate, and to have low noise. Moreover, once the required predistortion curves have been found, they need to be implemented in a real system with limited table sizes. Accordingly, the discussion will now focus on means and methods that combine fast characterization and small tables.

Figure 10:
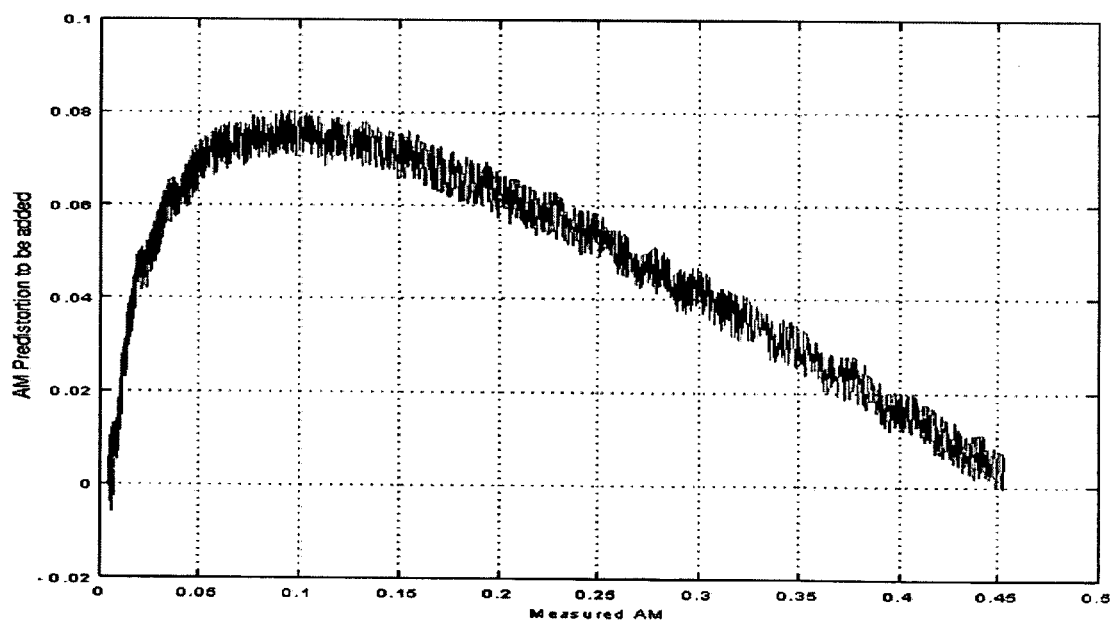
FIG. 10 is a graph showing an exemplary noisy AM predistortion curve generated by means of the Triangle Method.

Assume that an AM/AM characterization generated by means of the Triangle Method has resulted in an AM predistortion curve like the one depicted in FIG. 10, in which the determined AMpre is plotted as a function of AMmeas. It is evident that there is a significant amount of noise in the determined AMpre.

The noise could have been reduced if some kind of filtering or averaging had been added to the measurement system. However, averaging takes time, and time costs money—especially on the production line, where every second counts. Moreover, adding (more) filtering in the measurement setup requires that one know what to filter, but this is not always the case. The same applies if it is decided to introduce digital post-filtering in the computer that takes the measurements.

Thus, in accordance with another aspect, a technique herein called "data extraction" will now be described that determines, from noisy results such as those depicted in FIG. 10, a set of useful data points for use in the lookup tables that generate predistortion (e.g., the lookup tables depicted in FIG. 1). An exemplary embodiment of a "data extraction" process is described in the following steps:

1. First, find the highest value on the x-axis, max(x). Taking the results shown in FIG. 10 as an example, this means finding max(AMmeas), which is about 0.45.
2. Next, divide the x-axis into a number of intervals. If a table with E entries is going to be used, then use E intervals. The distance between the center of each interval will be Step=max(x)/E or, even more generally, Step=[max(x)-min(x)]/E (in case the minimum value of x is not equal to zero).
3. Choose a value, Start, on the x-axis, from where the signal processing should start. Also decide what IntervalSize to use. The values of these two parameters should be chosen such that the lower limit of the first interval (LowLimit=Start−IntervalSize/2) as well as the higher limit of the first interval (HighLimit=Start+IntervalSize/2) can be defined without ending up at values that are not valid. In other words, in this example, we have to choose Start such that LowLimit>min(AMmeas) and that HighLimit<max(AMmeas). If a variable Mid is defined to be the value in the middle of an interval, this means that Mid=Start in the interval that that the process starts with.
4. The signal processing starts with determining (and counting) which (and how many) of the samples of the measured signal meet the following criterion: Start−IntervalSize/2<AMmeas<Start+IntervalSize/2. The results are saved in a vector which, in this example, is called Interesting. The elements of the vector Interesting include the sample numbers (e.g., location) for the sample pairs (x, y)=(AMmeas,AMpre) that should be investigated further. The vector length of Interesting is the averaging factor F that is going to be used in step 5.
5. Calculate the mean value of AMpre in each interval i:

$AMpre_{Avg,i}=\text{mean}\{AMpre|_i\}=\text{sum}\{AMpre|_i\}/F$

6. For the interval i, a weighted average value for AMpre has now been calculated, and thereby filtered out a point $(x_i, y_i)=(Mid_i, AMpre_{Avg,i})$.
7. Repeat steps 4–6 for all remaining intervals.

The following shows an example of how the extracting algorithm may be implemented in Matlab®:

```
%
NumSteps=32;
Xmax=Amlevel; (sets highest Amplitude)
Step=Xmax/NumSteps;
IntervalSize=Xmax/16;
LowLimit=Xmax;
interesting=[];
number_of_samples_AMpredist=zeros(1,NumSteps);
sum_AM_predist=zeros(1,NumSteps);
Mid_old=Xmax+Step;
for r=1:NumSteps
    Mid_new=Mid_old-Step;
    HighLimit=Mid_new+IntervalSize/2;
    LowLimit=Mid_new-IntervalSize/2;
    interesting=find(AM_meas>LowLimit & AM_meas<HighLimit);
    number_of_samples_AMpre(r)=length(interesting);
    sum_AM_predist(r)=sum(AM_predist(min(interesting):max(interesting)));
    AM_predist32(r)=sum_AM_predist(r)/number_of_samples_AMpre(r);
    AM_meas32(r)=Mid_new;
    Mid_old=Mid_new;
end
%
```

Figure 11A:
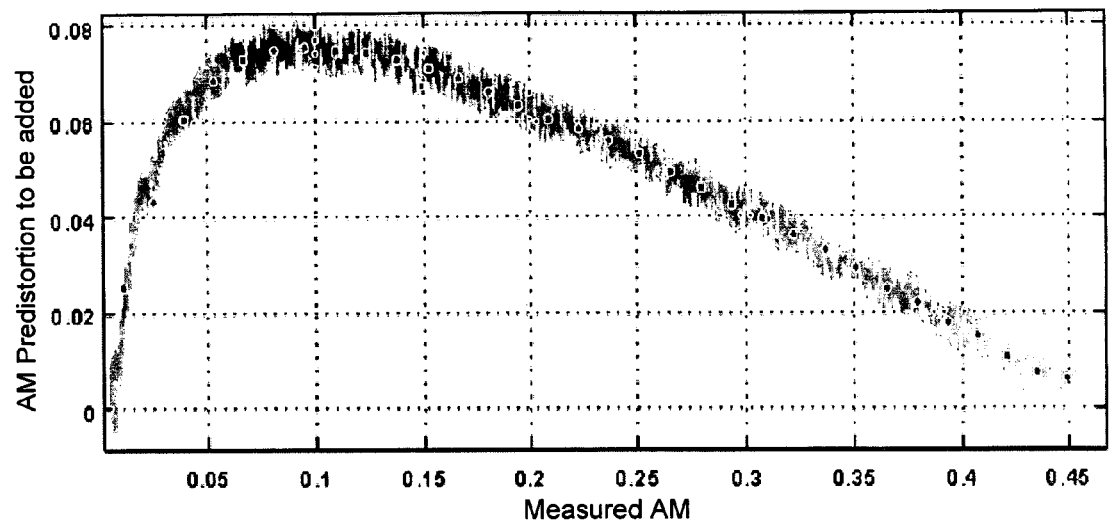
FIG. 11a is a graph of exemplary results obtained by applying the extracting algorithm to the noisy data depicted in FIG. 10.
Figure 11B:
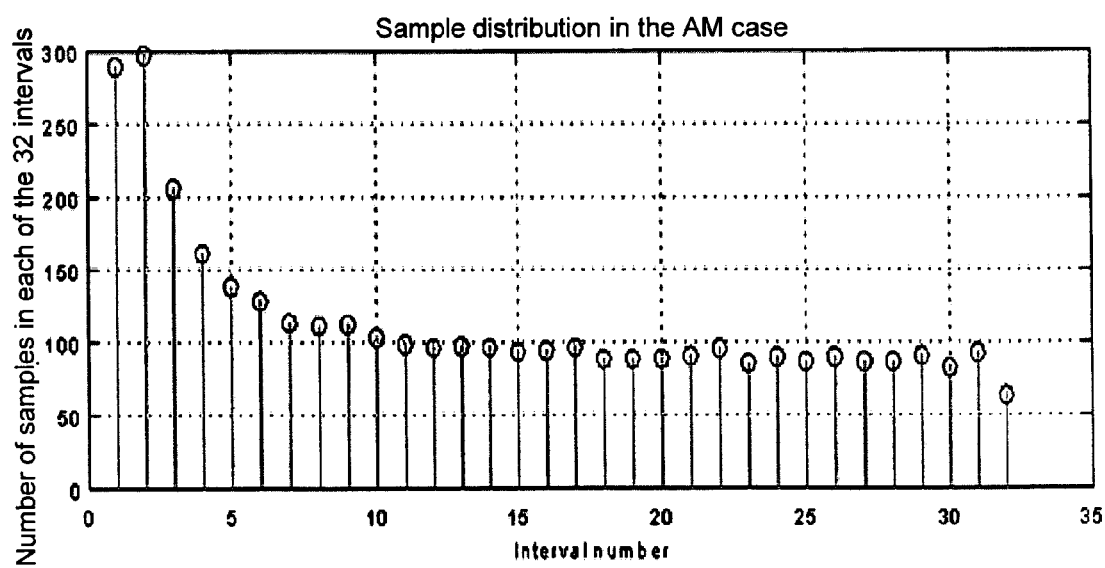
FIG. 11b is a graph showing the averaging factor Fi used in each respective interval (i=1 to 32) of the graph depicted in FIG. 10.

FIGS. 11a and 11b show an example where the extracting algorithm has been used on the data depicted in FIG. 10. In this case, 32 intervals have been used. FIG. 11a shows the original AMpre vs AMmeas curve (gray line), and also the points $(x_i, y_i) = (Mid_i, AMpre_{Avg,i})$ (depicted as black dots) generated by the averaging algorithm. FIG. 11b shows the averaging factor Fi used in each respective interval (i=1 to 32).

Figure 12:
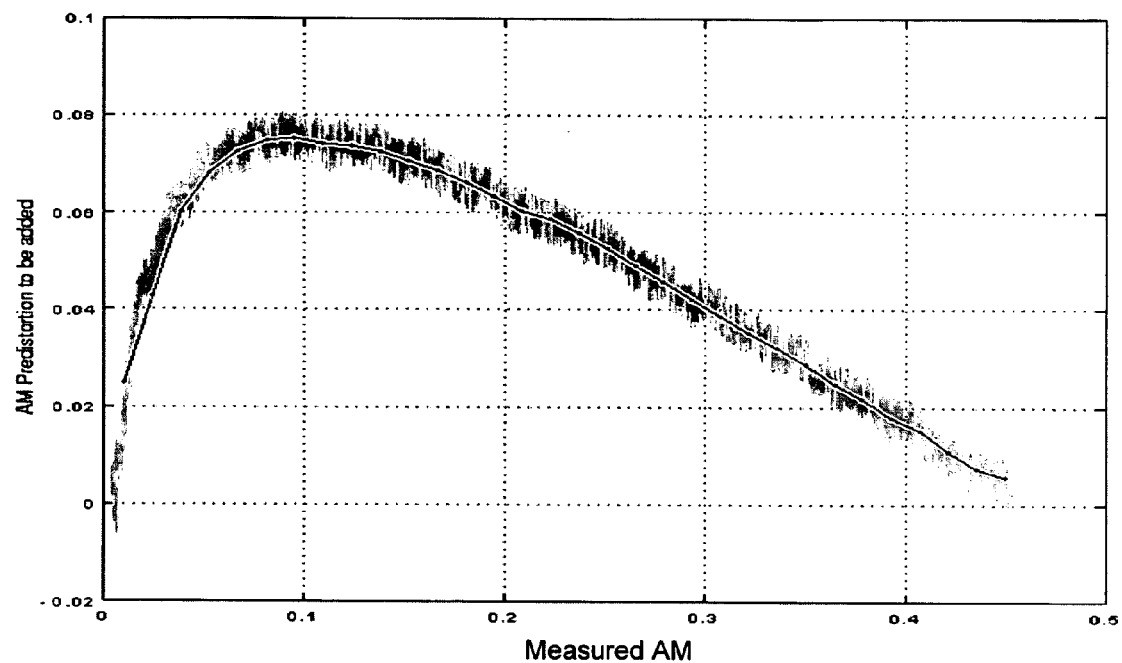
FIG. 12 is a graph showing exemplary results of linear interpolation line applied to the points generated by the extracting algorithm.

When a predistortion table is used in an application, some kind of interpolation must be used to "fill the gaps" between a point and its closest neighboring point(s). As an example, FIG. 12 shows the result of linear interpolation (solid black line) applied to the points (black dots) generated by the extracting algorithm. To facilitate comparison, these are superimposed on the original AMpre vs AMmeas curve (gray line). It can be seen that the extracting algorithm is able to generate meaningful predistortion from the noisy measurement results.

Figure 13:
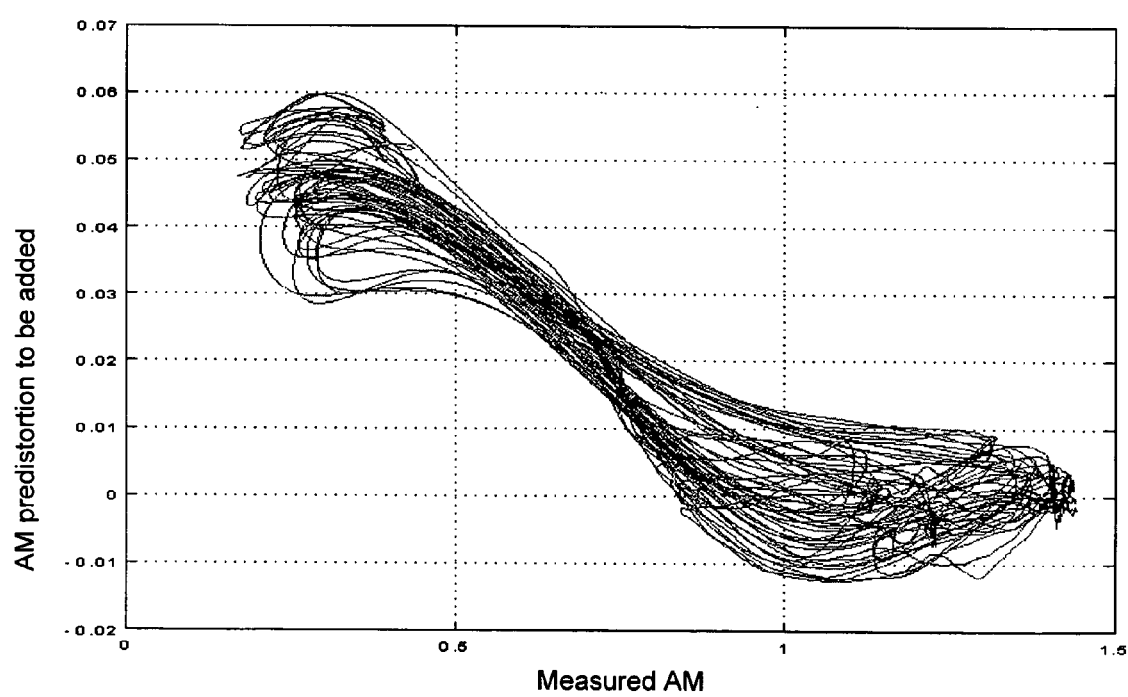
FIG. 13 is an exemplary AM predistortion curve generated by means of the Modulation Method, with an EDGE-modulated signal being used as the reference signal.
Figure 14:
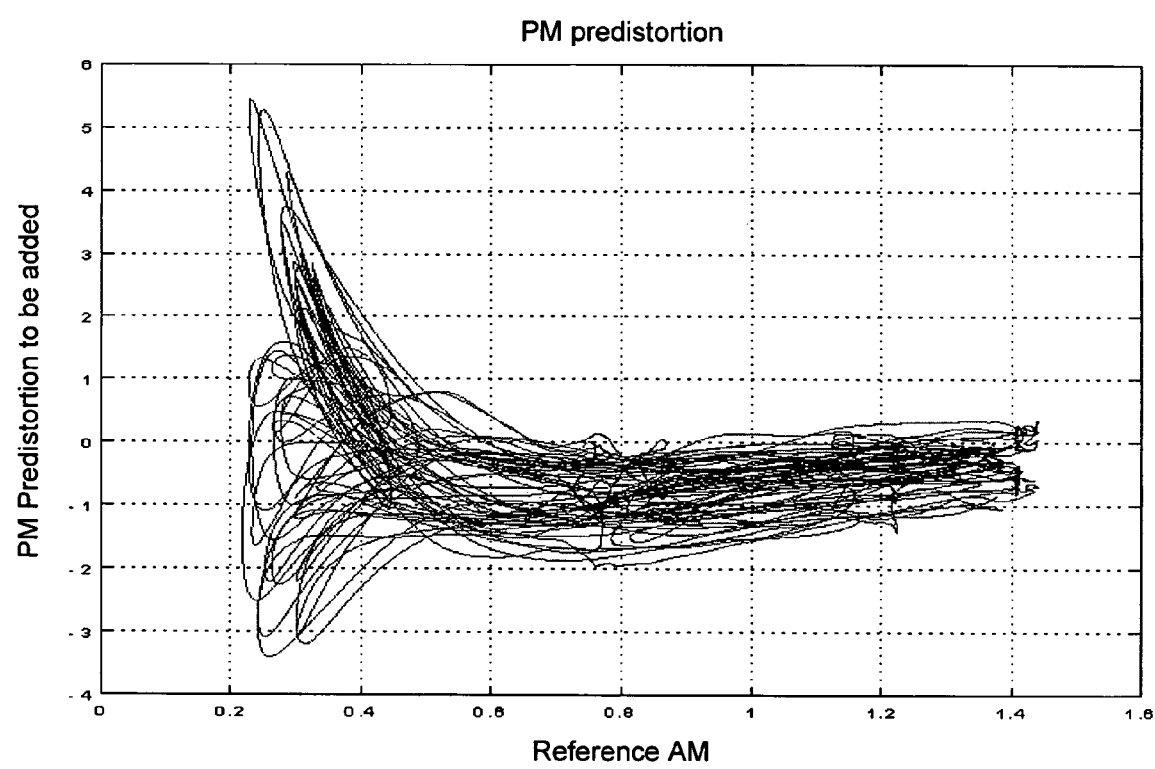
FIG. 14 is an exemplary PM predistortion curve generated by means of the Modulation Method, with an EDGE-modulated signal being used as the reference signal.

When the Modulation Method is used to generate predistortion information, the extracting algorithm is again useful for determining the set of points to be used for the predistortion lookup tables. To better appreciate the benefits, consider an example in which an EDGE-modulated signal is used in the Modulation Method. Here, the two reference signals—one for the EDGE AM-part and one for the PM-part respectively—have frequency components in the region of 1 MHz. The nature of the EDGE signal will cause the relation between the reference value (e.g. AMref) and the measured value (e.g. AMmeas) to be varying. As a consequence the AM and PM predistortion curves will look as shown in FIGS. 13 and 14, respectively. It is apparent that, even if non-noisy results are obtained from the Modulation Method, there is a non-functional relationship between the AM predistortion to be added and the AM predistortion. Consequently, there do not exist immediately apparent sets of points with which to construct predistortion lookup tables. However, the extracting algorithm is capable of sorting through all of this data to derive relevant points for both AM predistortion and PM predistortion.

Figure 15A:
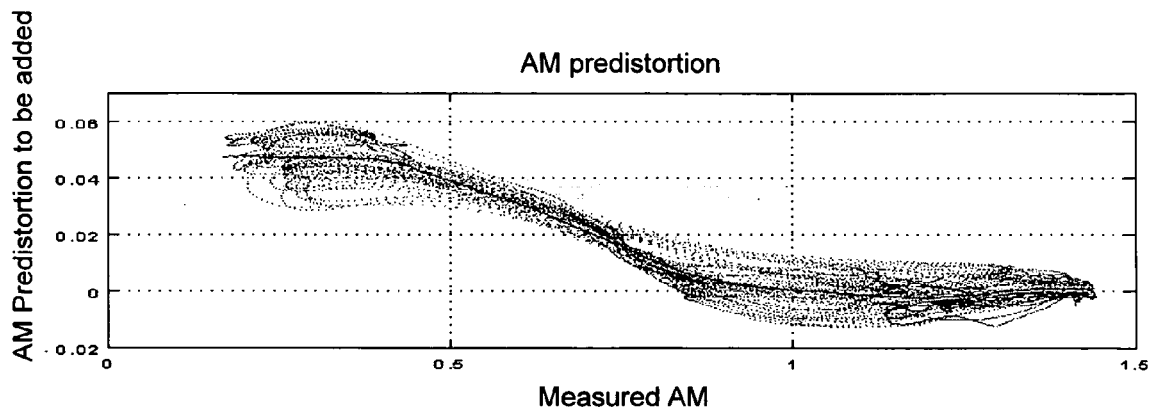
FIG. 15a is an exemplary graph showing the results of applying the extracting algorithm to the AM predistortion data depicted in FIG. 13.
Figure 15B:
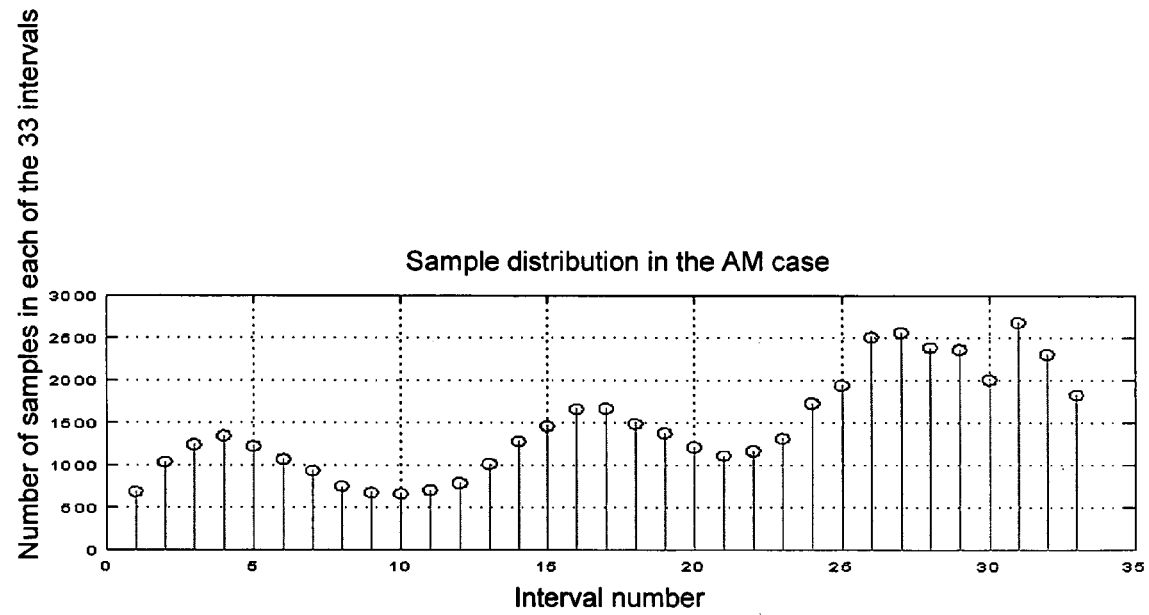
FIG. 15b is a graph showing the averaging factor Fi used in each respective interval (i=1 to 33) of the graph depicted in FIG. 13.

This is illustrated by FIG. 15a, which is an exemplary graph showing the results of applying the extracting algorithm to the AM predistortion data depicted in FIG. 13. The results of linear interpolation between the generated points are also depicted. FIG. 15b is a graph showing the averaging factor Fi used in each respective interval (i=1 to 33) of the graph depicted in FIG. 13.

Figure 16A:
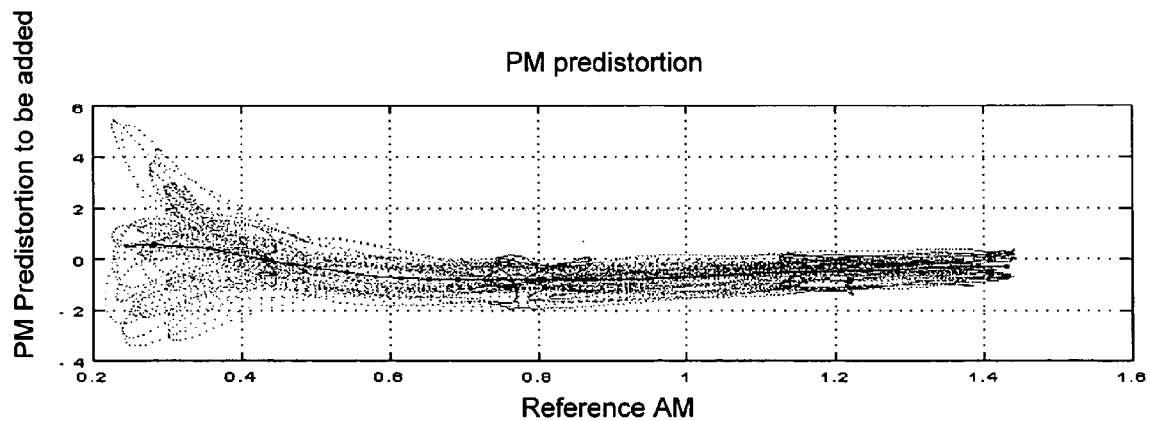
FIG. 16a is an exemplary graph showing the results of applying the extracting algorithm to the PM predistortion data depicted in FIG. 14.
Figure 16B:
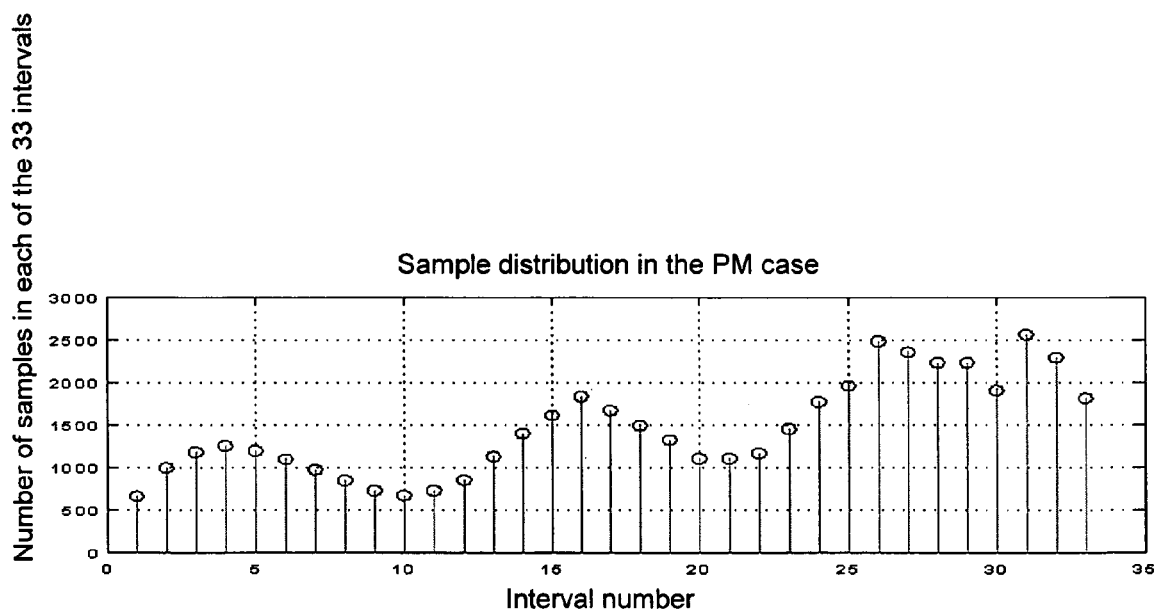
FIG. 16b is a graph showing the averaging factor Fi used in each respective interval (i=1 to 33) of the graph depicted in FIG. 14.

Similarly, FIG. 16a is an exemplary graph showing the results of applying the extracting algorithm to the PM predistortion data depicted in FIG. 14. The results of linear interpolation between the generated points are also depicted. FIG. 16b is a graph showing the averaging factor Fi used in each respective interval (i=1 to 33) of the graph depicted in FIG. 14.

As explained earlier, both the Triangle Method and the Modulation Method involve comparing the measured results with the applied reference signal. To achieve the best results, this comparison should be made after first having time-aligned the two signals. Several techniques will now be presented for aligning the reference and measured signals.

Figure 17A:
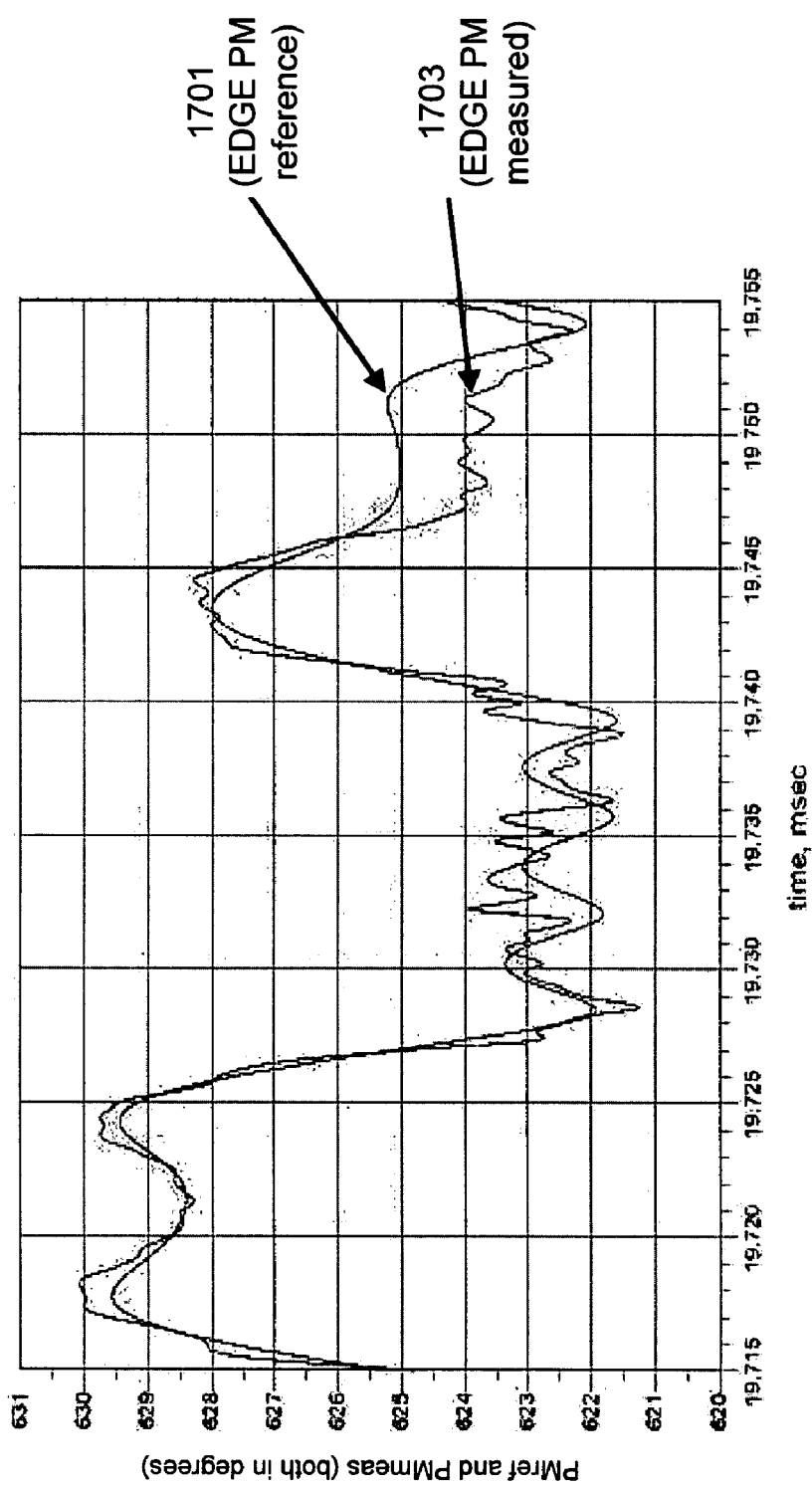
FIG. 17a shows both a graph depicting both the AM part of an EDGE reference signal and another graph depicting the measured AM part of the output when a configuration such as that shown in FIG. 2 is used.

A first of these techniques is herein referred to as the "dips technique." As the name suggests, this technique uses the AM or PM dips in the modulation (depending on which type of modulation one wants to align) to find the optimum alignment. As an example, FIG. 17a shows both a graph 1701 depicting the PM part of an EDGE reference signal and another graph 1703 depicting the measured PM part of the output when a configuration such as that shown in FIG. 2 is used (i.e., a configuration without predistortion). The objective of the dips technique is to determine what time shift can be applied to one of the graphs to best line up the dips that are evident in the respective signals.

Figure 17B:
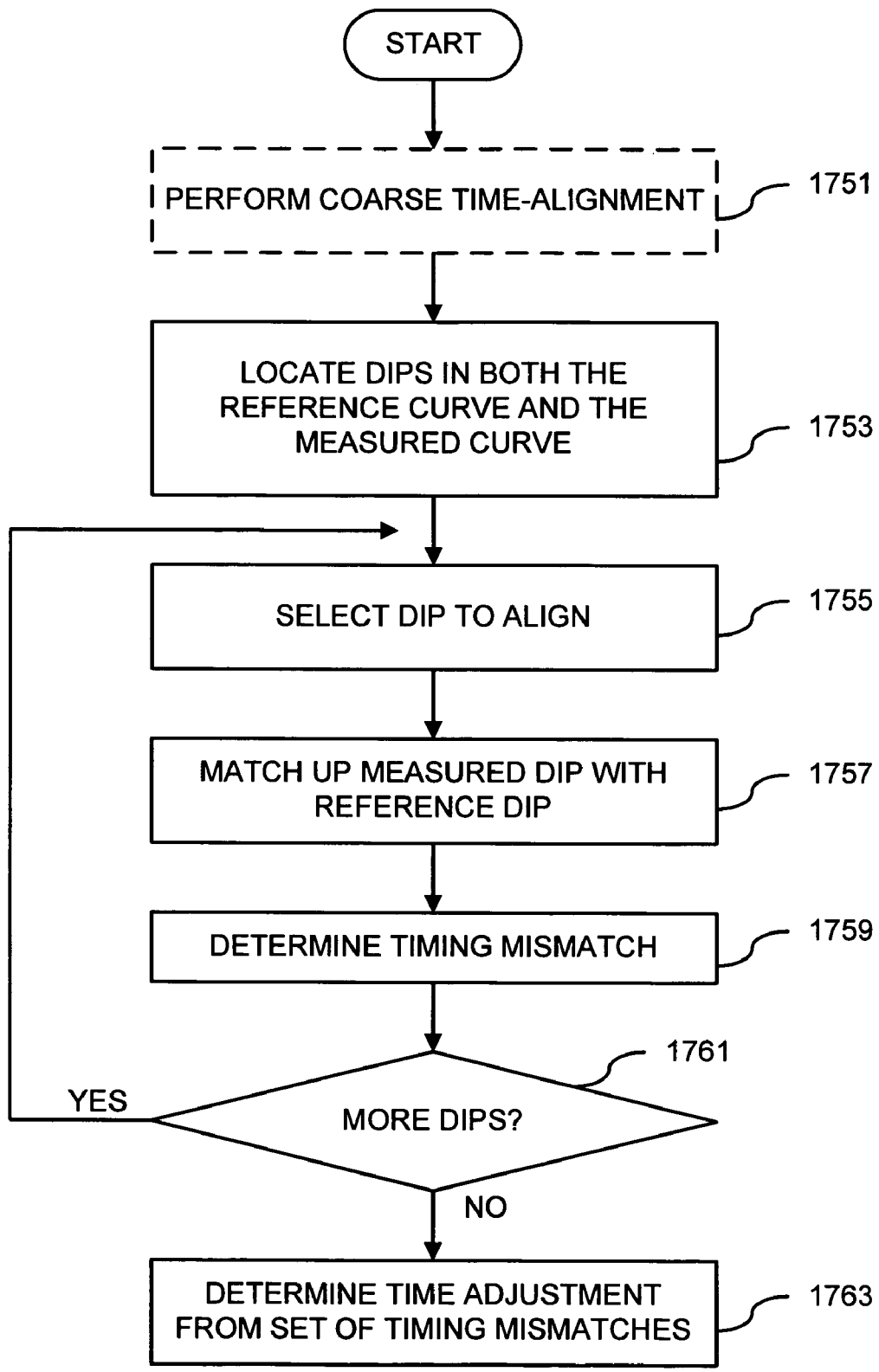
FIG. 17b is a flowchart of an exemplary process for carrying out the dips technique of aligning reference and measured signals.

FIG. 17b is a flowchart of an exemplary process for carrying out the dips technique. The procedure can for example start with doing a rough/coarse time-alignment (e.g. using mathematical correlation) (step 1751). Block 1751 in FIG. 17b is depicted in dashed lines to indicate that this step is optional.

The next step is to find all dips (minima), in each of the two curves (i.e. the reference curve 1701 and the measured curve 1703 respectively) that are below a certain level (threshold) (step 1753). That is, a threshold value is selected, and all points on the curve that lie below that threshold level are identified as being part of a dip. For each of the dips in the reference curve ("selection" step 1755 in conjunction with decision block 1761), an attempt is made to find a dip in the measurement curve 1703 that could correspond to the "reference dip" in the reference curve 1701 (step 1757). If a "measured" dip is found that seems to match the "reference dip", we have a "dip pair". The next step will be to find out the timing mismatch between each pair of dips (step 1759). After all of the dips have been analyzed ("NO" path out of decision block 1761), a decision is finally made about what time adjustment ($\Delta t$) is needed to align the measurement curve and the reference curve (step 1763).

One possible basis for deciding on a suitable value of $\Delta t$ is an average value:

$$\Delta t_{avg} = (\Delta t_1 + \Delta t_2 + \ldots \Delta t_{N-1} + \Delta t_N)/N,$$

assuming that N pairs of dips have been found. In a time-discreet system, it may not be possible to exactly perform the amount of shifting indicated by $\Delta t_{avg}$, because $\Delta t_{avg}$ is a real number. Thus, if $T_s$ is the sample period, one can use $k_{avg} \cdot T_s$ (where $k_{avg}$ is an integer) as an approximation of $\Delta t_{avg}$. The value of $k_{avg}$ can be determined as:

$$k_{avg} = \text{ROUND}(\Delta t_{avg}/T_s),$$

where "ROUND(x)" is a function that finds the closest integer value of the argument x. The value of $k_{avg}$, then, indicates the number of discrete time steps the ideal time shift corresponds to.

An alternative basis for deciding on a suitable value of $\Delta t$ is a majority decision. That is, for each pair of dips, p, determine how many samples, k, the time adjustment corresponds to. If $T_s$ is the sample period, we can write $\Delta t_p \approx k_p \cdot T_s$ for sample pair p. After having checked all pairs, the process then determines which value of k is most common.

An alternative technique for aligning the reference and measured signals is herein called the "spread technique." This technique is very accurate, and involves analyzing the AM/AM and/or AM/PM distortion. When signals such as EDGE-modulated signals are used as reference signals in the characterization process, there will always be a "spread" in these curves. As used herein, the term "spread" refers to the difference between a maximum amount of required predistortion and a minimum amount of predistortion for any given value of the measured AM signal (for an AM predistortion curve) or the AM reference signal (for a PM predistortion curve. See, for example, FIGS. 13 and 14. To take an example, consider the point on the AM predistortion curve where the measured AM signal (represented in units of "volts") is equal to a value of 0.5. Here, the minimum amount of necessary AM predistortion is approximately 0.03, and the maximum amount of necessary AM predistortion is approximately 0.046. The spread at this point is therefore 0.046−0.03=0.016. Similar calculations can be performed to determine the spread at other values of the measured AM signal, so that a curve can be generated representing the spread for various values of the AM reference signal.

The amount of spread that one finds in a predistortion curve is related to how well time-aligned the reference and measured signals are when the predistortion curve is generated; the more aligned they are, the smaller the spread. This property can be used to find a suitable alignment between the reference and measured signals. The process involves methodically shifting the reference and measured curves relative to one another, and determining the resultant affect on the spread of the corresponding predistortion curve. If the measurements are sampled, a time delay of $\Delta t$ can be considered optimal if it satisfies both:

$$\text{Spread}(kT_s) < \text{Spread}((k-1)T_s); \text{ and}$$

$$\text{Spread}(kT_s) < \text{Spread}((k+1)T_s),$$

where k is a sample number, $T_s$ is the sample period, and the spread is defined as:

$$\text{Spread (AMref)} = \max\{\text{Predist(AMref)}\} - \min\{\text{Predist (AMref)}\}. \quad (11)$$

Figure 18A:
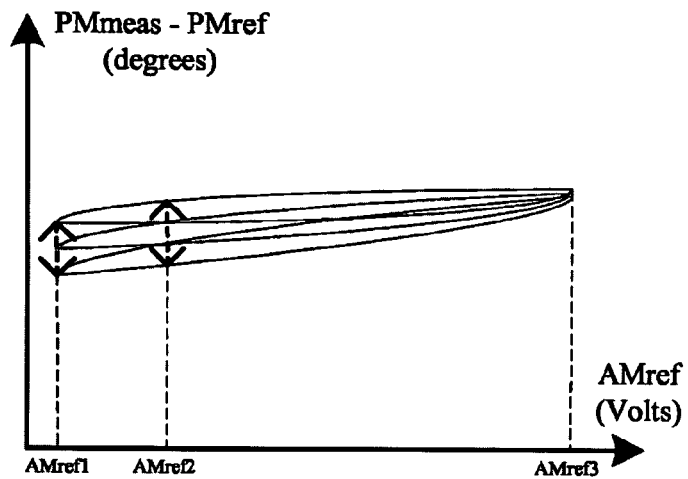
FIGS. 18a, 18b, and 18c each include a graph of phase spread (PMmeas-PMref) of a signal (e.g., an EDGE-modulated signal) plotted as a function of AMref for respectively different time alignment values.
Figure 18B:
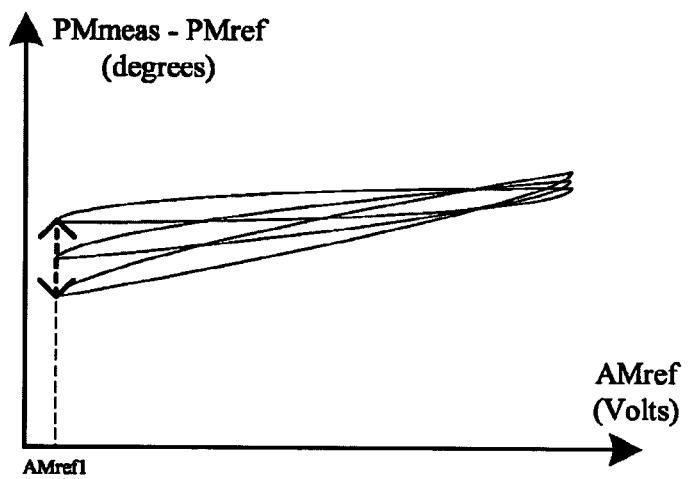
Figure 18C:
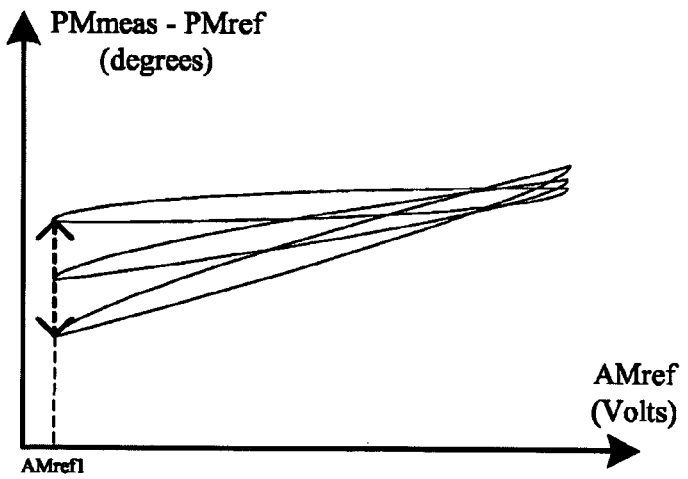

The effect of alignment on delay spread is illustrated in FIGS. 18a, 18b and 18c, each of which includes a graph of phase spread (PMmeas−PMref) of a signal (e.g., an EDGE-modulated signal) plotted as a function of AMref for respectively different time alignment values. FIG. 18a depicts the ideal situation. In this figure, the delay spread is shown for three values of AMref, identified as AMref1, AMref2, and AMref3. Here, the largest spread is found in the vicinity of AMref2.

FIG. 18b shows what happens to delay spread when the measured signal and the reference signal are not time aligned. Here it can be seen that the spread (indicated by the length of the double arrow) at AMref1 is larger than for this case than for the corresponding point in the ideal case (FIG. 18a).

FIG. 18c shows what happens when the timing error becomes even worse—the spread increases further, as illustrated by the still longer double arrow at point AMref1 compared to the corresponding spreads illustrated in FIGS. 18a and 18b.

In yet another alternative, the max{.} and min{.} functions are re-defined in a way that reduces the impact from measurement noise. Let these functions be called $\max_{NR}\{.\}$ and $\min_{NR}\{.\}$, respectively (where the subscript "NR" indicates Noise Reduction). An exemplary embodiment of these functions and of their use is illustrated in the following steps:

1. Find $\text{Predist}_{max}(\Delta t) = \max\{\text{Predist}(\Delta t)\}$ and $\text{Predist}_{min}(\Delta t) = \min\{\text{Predist}(\Delta t)\}$, using the traditional definitions of max{.} and min{.}.
2. Calculate the spread as:

$$\text{Spread}(\Delta t) = \text{Predist}_{max}(\Delta t) - \text{Predist}_{min}(\Delta t)$$

3. Divide the Predist signal into M intervals along the direction of the spread, where each part is L=Spread/M.
4. Let $\text{Predist}_1$ be all values in interval 1: $\text{Predist}_{min}$ to $\text{Predist}_{min} + L$
5. Let $\text{Predist}_M$ be all values in interval M: $\text{Predist}_{max} - L$ to $\text{Predist}_{max}$ 6. Then, define $\min_{NR}\{.\}$, $\max_{NR}\{.\}$ and $\text{Spread}_{NR}$ as $$\min_{NR} = \text{avg}\{\text{Predist}_1\} \quad (12)$$

$$\max_{NR} = \text{avg}\{\text{Predist}_M\} \quad (13)$$

$$\text{Spread}_{NR} = \max_{NR} - \min_{NR} \quad (14)$$

Equation (14) will give more reliable results than equation (11) in noisy environments because it utilizes averages of a group of low values and of a group of high values. This filtering effect can be adjusted by changing the number M. When the value of M is decreased, the filtering effect is enhanced. However, M should be set high enough to give the required precision for the parameter $\text{Spread}_{NR}$.

If both AM/AM and AM/PM are used to find the best alignment and they differ, then different alignment values (i.e., delays between AM and PM references) should be chosen.

Having described various aspects of the invention, an overall process for generating predistortion lookup table values for a power amplifier under test will now be described with reference to the flowchart of FIG. 19. Of course it is anticipated that this process will be carried out by automated machinery/circuitry under the direction of, for example, a programmable processor running a suitable set of instructions.

The process begins by running the power amplifier/AM modulator using a reference signal, AMref, in a configuration such as that depicted in FIG. 2 (step 1901). The amplitude (AMmeas), and phase (PMmeas) response is measured at the output of the power amplifier, with the measured response being represented as either I and Q values, or alternatively as phase and amplitude (step 1903).

The AMref to AMmeas signals should be set to a ratio at the peak reference value, such as 1:1 (step 1905). That is, the results are normalized so that they can be represented on the same scale.

The amplitude and phase results will be analyzed separately. Thus, in the event that the measured response was obtained in the form of I and Q values, these should be converted to amplitude and phase values. Looking first at the amplitude analysis, the AMref and AMmeas signals are time aligned (step 1907), using any of a number of techniques, such as but not limited to the techniques described earlier.

The measured data is scaled to fit a given dynamic range and resolution for a given baseband representation (step 1909). For example, if 8-bits are used to represent numbers, then the data is scaled to use 256 possible levels (ranging from 0 to 255). The AMref values are then mapped to corresponding values of AMmeas (step 1911).

M+1 points along the AMref curve are then selected, and the extraction algorithm is performed (as described earlier) to generate M+1 predistortion values (step 1913).

The M+1 predistortion values are then stored in a table for use as an AM/AM predistortion table (step 1915).

The phase values are processed in a similar manner. Beginning at step 1917, the PMref and PMmeas curves are time aligned using any of a number of techniques, such as but not limited to the techniques described earlier.

Figure 20A:
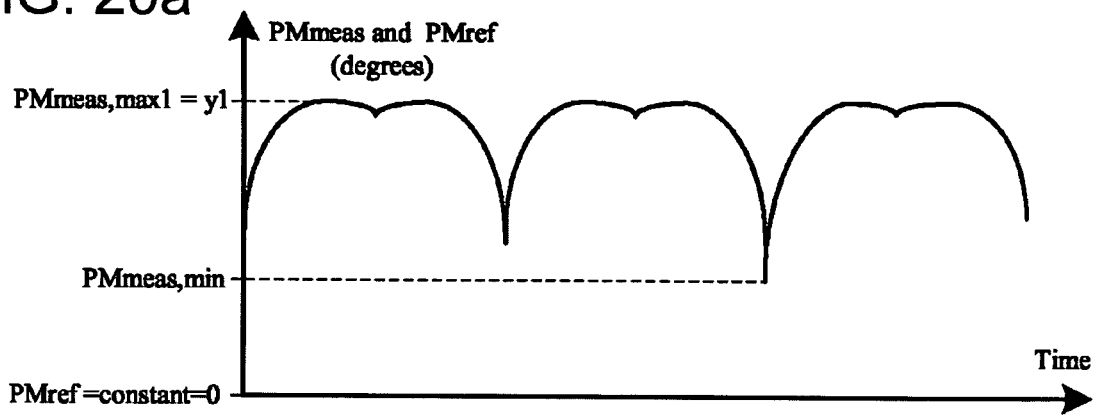
FIGS. 20a and 20b are graphs that illustrate the type of curve shifting performed in an exemplary embodiment of the invention.
Figure 20B:
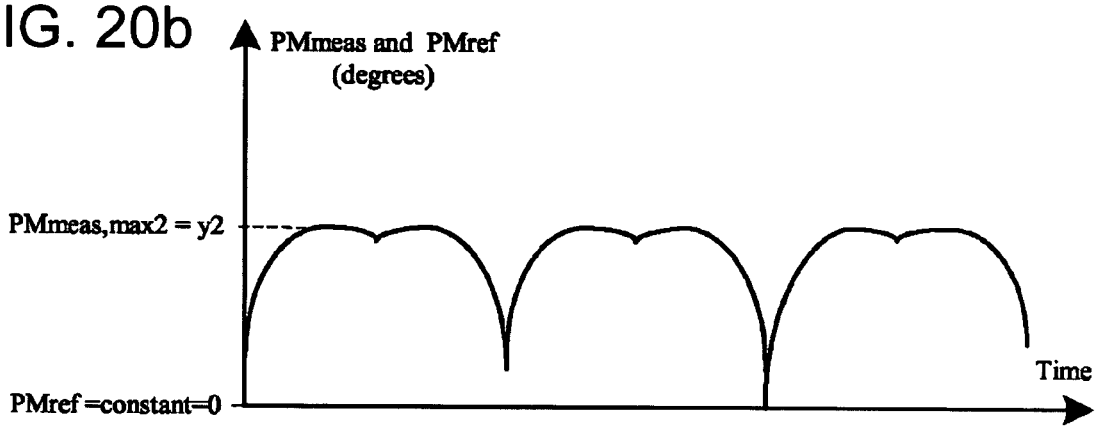

The PMmeas signals are then shifted in absolute value but relative data is kept (step 1919). FIGS. 20a and 20b illustrate the type of shifting performed in this step. FIG. 20a is a graph of PMmeas plotted as a function of time before any shift has been made. PMref is constant in time, and in this example has been set equal to 0 degrees. The largest difference between the measured phase and the reference phase is y=PMmeas,max1; and the smallest difference is PMmeas,min. Without shifting, the predistortion signal will have to span from 0 to PMmeas,max1.

FIG. 20b depicts the data of FIG. 20a being shifted down by PMmeas,min, which enables the resolution in the baseband to be used in a more effective way. This is because the predistortion signal only has to span from 0 to y2=PMmeas,max2=PMmeas,max1-PMmeas,min.

Returning now to FIG. 19, L+1 points along the AMref curve are then selected, and the extraction algorithm is performed (as described earlier) to generate L+1 predistortion values (step 1921).

The L+1 predistortion values are then stored in a table for use as an AM/PM predistortion table (step 1923).

The techniques described herein provide for fast calibration of predistortion for power amplifiers, enabling low-cost production of, for example, transmitters having power amplifier-modulators with sample variation. These techniques also provide for accurate one-step predistortion and lookup table generation including extracting and smoothing. Use of these techniques results in excellent modulation performance (e.g., Error Vector Magnitude, and Adjacent Channel Power Ratio), and relaxes the requirements on the power amplifier with respect to AM/AM and Am/PM distortion.

The invention has been described with reference to particular embodiments. However, it will be readily apparent to those skilled in the art that it is possible to embody the invention in specific forms other than those of the embodiment described above.

For example, the variously illustrated embodiments have assumed a mobile station using 1) a polar modulation radio architecture; and 2) predistortion with lookup tables. However, the techniques are applicable on other types of systems as well (e.g., linear radio architectures, predistortion using polynomials, and the like).

Thus, the described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of determining predistortion that will compensate for distortion introduced by a power amplifier circuit, the method comprising:
    applying a time-varying reference signal to the power amplifier circuit, wherein at each moment the time-varying reference signal has a reference amplitude and a reference phase;
    measuring a corresponding output signal supplied by the power amplifier circuit, wherein at each moment the output signal has a measured amplitude and a measured phase;
    determining amplitude predistortion by comparing the reference amplitude with the measured amplitude;
    determining phase predistortion by comparing the reference phase with the measured phase; and
    determining a relationship between the phase predistortion and the reference amplitude such that, for any value of the reference amplitude, a corresponding value of the phase predistortion is identified,
    wherein:
    the amplitude predistortion is associated with a range of measured amplitude values; and
    the method further comprises extracting representative points from the amplitude predistortion by performing:
        dividing the range of measured amplitude values into a number of intervals; and
        for each of the intervals, determining an average amplitude predistortion value and using the average amplitude predistortion values as the amplitude predistortion value associated with a measured amplitude value at the center of the interval.

2. The method of claim 1, wherein the reference amplitude is a ramp waveform, and the reference phase is a constant.

3. The method of claim 1, wherein the reference amplitude is a triangle waveform, and the reference phase is a constant.

4. The method of claim 1, wherein the reference signal has both varying amplitude and varying phase.

5. The method of claim , further comprising:
    interpolating between two average amplitude predistortion values respectively associated with adjacent first and second intervals to determine an amplitude predistortion value associated with a measured amplitude value that is in-between the centers of the first and second intervals.

6. The method of claim 1, wherein:
    the phase predistortion is associated with a range of reference amplitude values; and
    the method further comprises extracting representative points from the phase predistortion by performing:
        dividing the range of reference amplitude values into a number of intervals; and
        for each of the intervals, determining an average phase predistortion value and using the average phase predistortion value as the phase predistortion value associated with a reference amplitude value at the center of the interval.

7. The method of claim 6, further comprising:
    interpolating between two average phase predistortion values respectively associated with adjacent first and second intervals to determine a phase predistortion value associated with a reference amplitude value that is in-between the centers of the first and second intervals.

8. The method of claim 1, comprising:
    prior to comparing the reference amplitude with the measured amplitude, performing:
        identifying one or more dips in the reference amplitude;
        identifying one or more dips in the measured amplitude; and
        aligning the reference amplitude and the measured amplitude with respect to time by shifting the reference amplitude and the measured amplitude relative to one another by an amount that best aligns the dips of the reference amplitude with corresponding dips of the measured amplitude.

9. The method of claim 1, comprising:
    prior to comparing the reference phase with the measured phase, performing:
        identifying one or more dips in the reference phase;
        identifying one or more dips in the measured phase; and
        aligning the reference phase and the measured phase with respect to time by shifting the reference phase and the measured phase relative to one another by an amount that best aligns the dips of the reference phase with corresponding dips of the measured phase.

10. The method of claim 1, comprising:
prior to comparing the reference amplitude with the measured amplitude, aligning the reference amplitude and the measured amplitude with respect to time by an amount that minimizes a spread between a plurality of amplitude predistortion values associated with any one amplitude reference value.

11. The method of claim 10, comprising:
determining the spread by determining the difference between a minimum one of the amplitude predistortion values associated with the amplitude reference value and a maximum one of the amplitude predistortion values associated with the amplitude reference value.

12. The method of claim 10, comprising:
determining a set of highest valued ones of the amplitude predistortion values associated with the amplitude reference value;
determining a set of lowest valued ones of the amplitude predistortion values associated with the amplitude reference value;
determining a noise reduced maximum value of the amplitude predistortion values by averaging the set of highest valued ones of the amplitude predistortion values associated with the amplitude reference value;
determining a noise reduced minimum value of the amplitude predistortion values by averaging the set of lowest valued ones of the amplitude predistortion values associated with the amplitude reference value; and
determining the spread by determining the difference between the noise reduced minimum value of the amplitude predistortion values and the noise reduced maximum value of the amplitude predistortion values.

13. The method of claim 1, comprising:
prior to comparing the reference phase with the measured phase, aligning the reference phase and the measured phase with respect to time by an amount that minimizes a spread between a plurality of phase predistortion values associated with any one amplitude reference value.

14. The method of claim 13, comprising:
determining the spread by determining the difference between a minimum one of the phase predistortion values associated with the amplitude reference value and a maximum one of the phase predistortion values associated with the amplitude reference value.

15. The method of claim 13, comprising:
determining a set of highest valued ones of the phase predistortion values associated with the amplitude reference value;
determining a set of lowest valued ones of the phase predistortion values associated with the amplitude reference value;
determining a noise reduced maximum value of the phase predistortion values by averaging the set of highest valued ones of the phase predistortion values associated with the amplitude reference value;
determining a noise reduced minimum value of the phase predistortion values by averaging the set of lowest valued ones of the phase predistortion values associated with the amplitude reference value; and
determining the spread by determining the difference between the noise reduced minimum value of the phase predistortion values and the noise reduced maximum value of the phase predistortion values.

16. An apparatus for determining predistortion that will compensate for distortion introduced by a power amplifier circuit, the apparatus comprising:
logic that applies a time-varying reference signal to the power amplifier circuit, wherein at each moment the time-varying reference signal has reference amplitude and a reference phase;
logic that measures a corresponding output signal supplied by the power amplifier circuit, wherein at each moment the output signal has a measured amplitude and a measured phase;
logic that determines amplitude predistortion by comparing the reference amplitude with the measured amplitude;
logic that determines phase predistortion by comparing the reference phase with the measured phase; and
logic that determines a relationship between the phase predistortion and the reference amplitude such that, for any value of the reference amplitude, a corresponding value of the phase predistortion is identified,
wherein:
the amplitude predistortion is associated with a range of measured amplitude values; and
the apparatus further comprises logic that extracts representative points from the amplitude predistortion by performing;
dividing the range of measured amplitude values into a number of intervals; and
for each of the intervals, determining an average amplitude predistortion value and using the average amplitude predistortion value as the amplitude predistortion value associated with a measured amplitude value at the center of the interval.

17. The apparatus of claim 16, wherein the reference amplitude is a ramp waveform, and the reference phase is a constant.

18. The apparatus of claim 16, wherein the reference amplitude is a triangle waveform, and the reference phase is a constant.

19. The apparatus of claim 16, wherein the reference signal has both varying amplitude and varying phase.

20. The apparatus of claim , further comprising:
logic that interpolates between two average amplitude predistortion values respectively associated with adjacent first and second intervals to determine an amplitude predistortion value associated with a measured amplitude value that is in-between the centers of the first and second intervals.

21. The apparatus of claim 16, wherein:
the phase predistortion is associated with a range of reference amplitude values; and
the apparatus further comprises logic that extracts representative points from the phase predistortion by performing:
dividing the range of reference amplitude values into a number of intervals; and
for each of the intervals, determining an average phase predistortion value and using the average phase predistortion value as the phase predistortion value associated with a reference amplitude value at the center of the interval.

22. The apparatus of claim 21, further comprising:
logic that interpolates between two average phase predistortion values respectively associated with adjacent first and second intervals to determine a phase predistortion value associated with a reference amplitude value that is in-between the centers of the first and second intervals.

23. The apparatus of claim 16, comprising:
logic that, prior to comparing the reference amplitude with the measured amplitude, performs:
identifying one or more dips in the reference amplitude;
identifying one or more dips in the measured amplitude; and
aligning the reference amplitude and the measured amplitude with respect to time by shifting the reference amplitude and the measured amplitude relative to one another by an amount that best aligns the dips of the reference amplitude with corresponding dips of the measured amplitude.

24. The apparatus of claim 16, comprising:
logic that, prior to comparing the reference phase with the measured phase, performs:
identifying one or more dips in the reference phase;
identifying one or more dips in the measured phase; and
aligning the reference phase and the measured phase with respect to time by shifting the reference phase and the measured phase relative to one another by an amount that best aligns the dips of the reference phase with corresponding dips of the measured phase.

25. The apparatus of claim 16, comprising:
logic that, prior to comparing the reference amplitude with the measured amplitude, aligns the reference amplitude and the measured amplitude with respect to time by an amount that minimizes a spread between a plurality of amplitude predistortion values associated with any one amplitude reference value.

26. The apparatus of claim 25, comprising:
logic that determines the spread by determining the difference between a minimum one of the amplitude predistortion values associated with the amplitude reference value and a maximum one of the amplitude predistortion values associated with the amplitude reference value.

27. The apparatus of claim 25, comprising:
logic that determines a set of highest valued ones of the amplitude predistortion values associated with the amplitude reference value;
logic that determines a set of lowest valued ones of the amplitude predistortion values associated with the amplitude reference value;
logic that determines a noise reduced maximum value of the amplitude predistortion values by averaging the set of highest valued ones of the amplitude predistortion values associated with the amplitude reference value;
logic that determines a noise reduced minimum value of the amplitude predistortion values by averaging the set of lowest valued ones of the amplitude predistortion values associated with the amplitude reference value; and
logic that determines the spread by determining the difference between the noise reduced minimum value of the amplitude predistortion values and the noise reduced maximum value of the amplitude predistortion values.

28. The apparatus of claim 16, comprising:
logic that, prior to comparing the reference phase with the measured phase, aligns the reference phase and the measured phase with respect to time by an amount that minimizes a spread between a plurality of phase predistortion values associated with any one amplitude reference value.

29. The apparatus of claim 28, comprising:
logic that determines the spread by determining the difference between a minimum one of the phase predistortion values associated with the amplitude reference value and a maximum one of the phase predistortion values associated with the amplitude reference value.

30. The apparatus of claim 28, comprising:
logic that determines a set of highest valued ones of the phase predistortion values associated with the amplitude reference value;
logic that determines a set of lowest valued ones of the phase predistortion values associated with the amplitude reference value;
logic that determines a noise reduced maximum value of the phase predistortion values by averaging the set of highest valued ones of the phase predistortion values associated with the amplitude reference value;
logic that determines a noise reduced minimum value of the phase predistortion values by averaging the set of lowest valued ones of the phase predistortion values associated with the amplitude reference value; and
logic that determines the spread by determining the difference between the noise reduced minimum value of the phase predistortion values and the noise reduced maximum value of the phase predistortion values.

31. A machine storage medium having stored therein a set of program instructions for determining predistortion that will compensate for distortion introduced by a power amplifier circuit, the set of program instructions causing a processor and associated logic to perform:
applying a time-varying reference signal to the power amplifier circuit, wherein at each moment the time-varying reference signal has a reference amplitude and a reference phase;
measuring a corresponding output signal supplied by the power amplifier circuit, wherein at each moment the output signal has a measured amplitude and a measured phase;
determining amplitude predistortion by comparing the reference amplitude with the measured amplitude;
determining phase predistortion by comparing the reference phase with the measured phase; and
determining a relationship between the phase predistortion and the reference amplitude such that, for any value of the reference amplitude, a corresponding value of the phase predistortion is identified,
wherein:
the amplitude predistortion is associated with a range of measured amplitude values; and
the method further comprises extracting representative points from the amplitude predistortion by performing:
dividing the range of measured amplitude values into a number of intervals; and
for each of the intervals, determining an average amplitude predistortion value and using the average amplitude predistortion value as the amplitude predistortion value associated with a measured amplitude value at the center of the interval.

* * * * *

UNITED STATES PATENT AND TRADEMARK OFFICE
CERTIFICATE OF CORRECTION

PATENT NO. : 7,330,073 B2
APPLICATION NO. : 11/168404
DATED : February 12, 2008
INVENTOR(S) : Persson et al.

Figure 19:
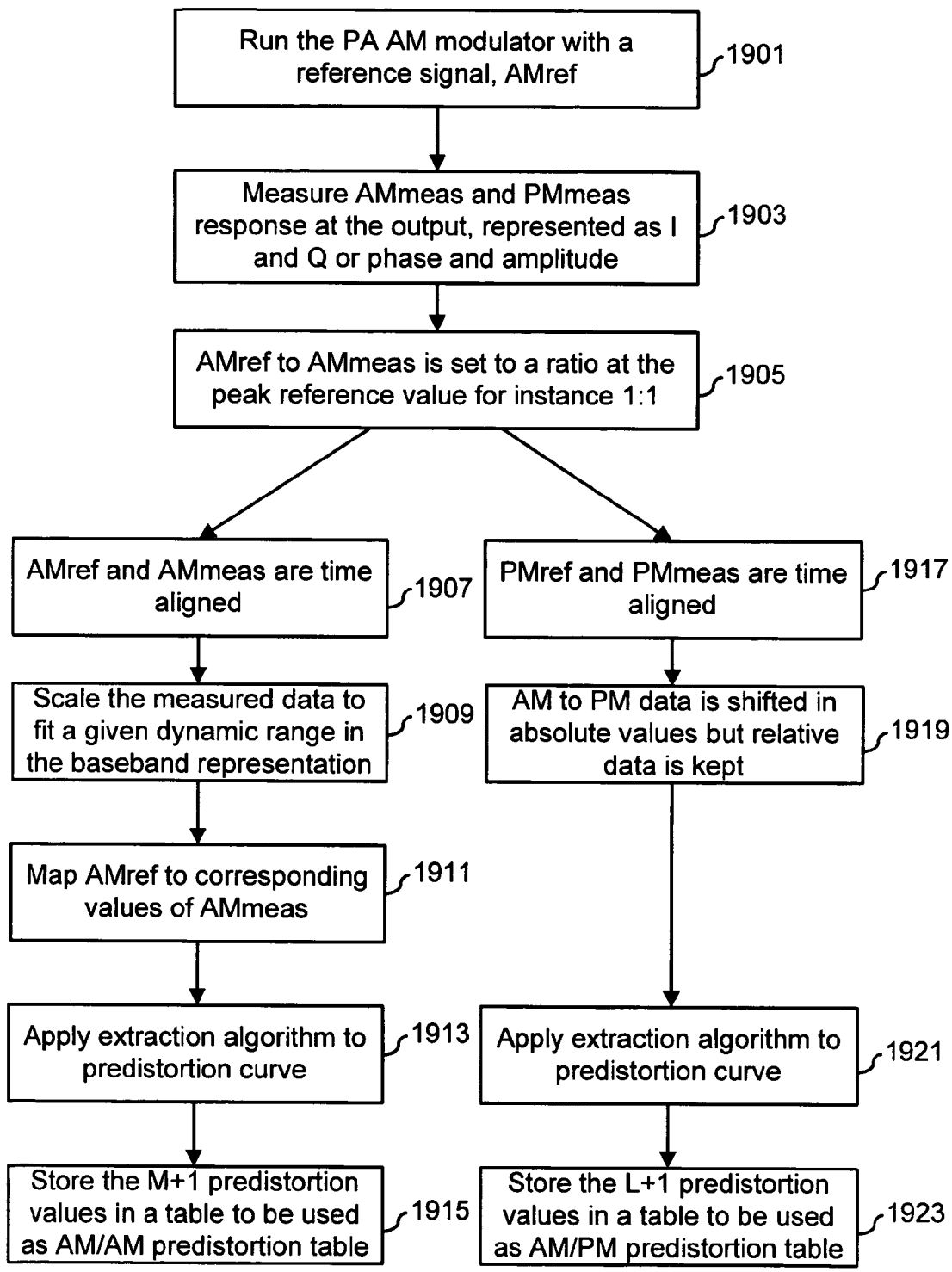
FIG. 19 is a flowchart depicting an exemplary overall process for generating predistortion lookup table values for a power amplifier under test.

It is certified that error appears in the above-identified patent and that said Letters Patent is hereby corrected as shown below:

In Fig. 19, Sheet 15 of 16, for Tag "1901", Line 1, delete "PA AM" and insert -- PA/AM --, therefor.

In Column 9, Line 15, delete "2)." and insert -- 2. --, therefor.

In Column 10, Line 36, delete

" $AMpre_{Avg,i} = mean\{AMpre|_i\} = sum\{AMpre|_i\}/F$ "

and insert -- $AMpre_{Avg,i} = mean\{AMpre|_i\} = sum\{AMpre|_i\}/F$ --, therefor.

In Column 15, Line 24, delete "Am/PM" and insert -- AM/PM --, therefor.

In Column 16, Line 7, in Claim 1, delete "values" and insert -- value --, therefor.

In Column 16, Line 18, in Claim 5, delete "claim ," and insert -- claim 1, --, therefor.

In Column 18, Line 27, in Claim 16, delete "performing;" and insert -- performing: --, therefor.

In Column 18, Line 43, in Claim 20, delete "claim ," and insert -- claim 16, --, therefor.

Signed and Sealed this

Fourteenth Day of October, 2008

JON W. DUDAS
*Director of the United States Patent and Trademark Office*